United States Patent [19]
Furukawa et al.

[11] Patent Number: 5,880,487
[45] Date of Patent: Mar. 9, 1999

[54] SEMICONDUCTOR DEVICE AND METHOD FOR MANUFACTURING THE SAME

[75] Inventors: Chisato Furukawa, Atsugi; Takayuki Matsuyama, Yokohama, both of Japan

[73] Assignee: Kabushiki Kaisha Toshiba, Kawasaki, Japan

[21] Appl. No.: 901,432

[22] Filed: Jul. 25, 1997

Related U.S. Application Data

[62] Division of Ser. No. 571,407, Dec. 13, 1995, Pat. No. 5,683,937.

[30] Foreign Application Priority Data

Dec. 15, 1994 [JP] Japan .................................. 6-333892

[51] Int. Cl.⁶ .................................................. H01L 33/00
[52] U.S. Cl. ......................... 257/99; 257/621; 257/622
[58] Field of Search .......................... 257/99, 618, 621, 257/622; 372/46

[56] References Cited

U.S. PATENT DOCUMENTS

| | | | |
|---|---|---|---|
| H170 | 12/1986 | Binari ....................................... | 437/184 |
| 4,448,797 | 5/1984 | Burnham ................................. | 437/184 |
| 4,525,919 | 7/1985 | Fabian ..................................... | 437/184 |
| 4,599,790 | 7/1986 | Kim et al. ................................ | 437/184 |
| 4,785,455 | 11/1988 | Sawai et al. ............................. | 372/46 |
| 4,904,608 | 2/1990 | Gentner et al. ......................... | 437/184 |
| 4,997,779 | 3/1991 | Kohno .................................... | 437/184 |
| 5,027,364 | 6/1991 | Thulke .................................... | 372/46 |
| 5,073,520 | 12/1991 | Yoshida .................................. | 437/184 |
| 5,341,002 | 8/1994 | Plumb ..................................... | 257/95 |
| 5,652,438 | 7/1997 | Sassa et al. ............................. | 257/94 |

FOREIGN PATENT DOCUMENTS

A-0293185 11/1988 European Pat. Off. .
A-0386634 9/1990 European Pat. Off. .
A-3713133 11/1988 Germany .

OTHER PUBLICATIONS

G. Du et al., Ohmic Heating and Series Resistance of a Vertical–Microcavity Surface–emitting Laser, Jul. 15, 1991, 265–267, Applied Physics Letters, vol. 59, No. 3, New York.

*Primary Examiner*—Sara Crane
*Attorney, Agent, or Firm*—Finnegan, Henderson, Farabow, Garrett & Dunner, L.L.P.

[57] ABSTRACT

A semiconductor device includes a rectangular semiconductor chip having a main surface, a stripe-form semiconductor element forming portion formed in parallel to one of sides of the semiconductor chip to cross the main surface, a first groove portion formed along one of sides of the semiconductor element forming portion in a longitudinal direction, a second groove portion formed along the other side of the semiconductor element forming portion in the longitudinal direction, the second groove portion including a hollow space which is enlarged in substantially a central portion, a surface electrode formed on at least part of an upper portion of the semiconductor element forming portion, an external lead connecting terminal electrode formed in the hollow space, a wiring formed on part of a bottom surface and a side surface, which is adjacent to stripe-form portion, of the second groove portion, for electrically connecting the surface electrode with the terminal electrode, a first dummy electrode formed at least on the main surface of the semiconductor chip to face the semiconductor element forming portion with the first groove portion disposed therebetween, and a second dummy electrode formed on the main surface of the semiconductor chip to face the semiconductor element forming portion with the second groove portion disposed therebetween.

21 Claims, 11 Drawing Sheets

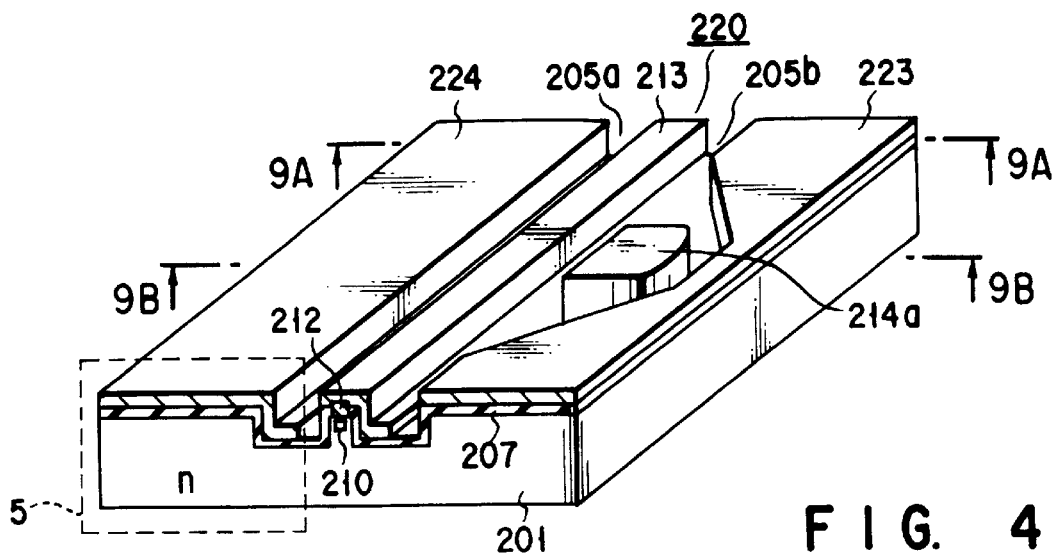
F I G. 4
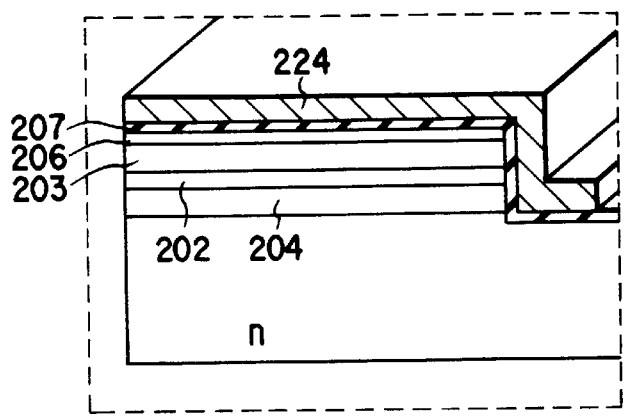
F I G. 5
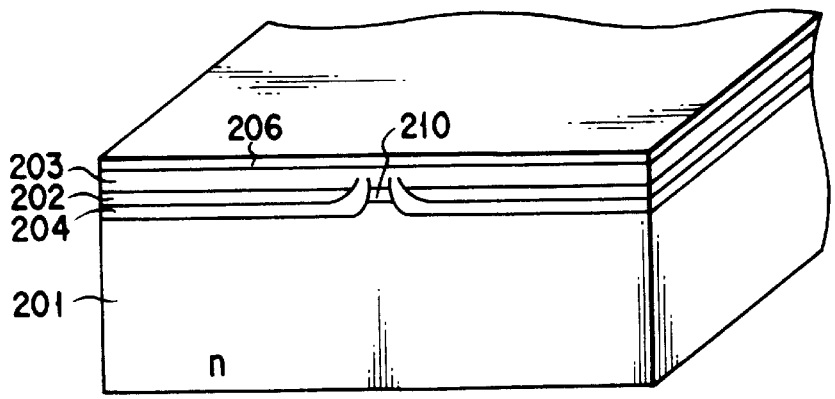
F I G. 6

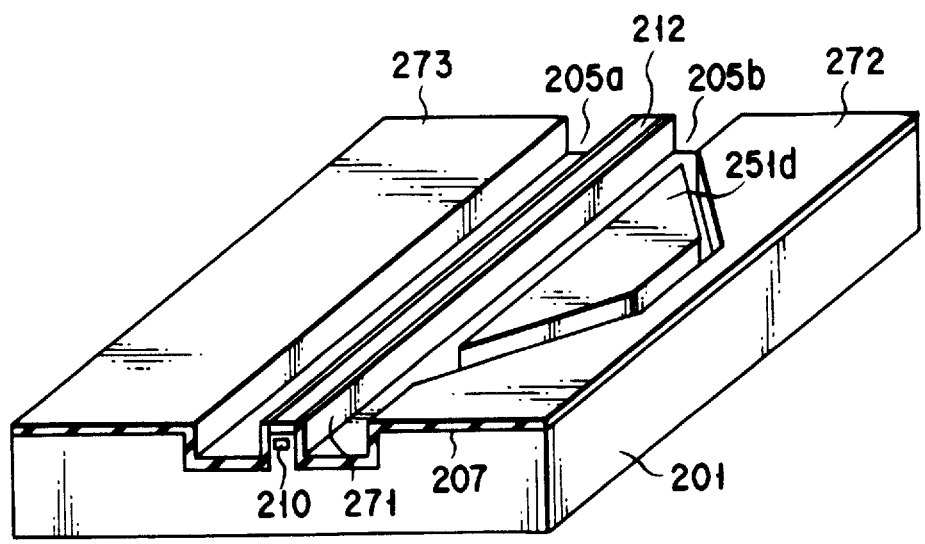
F I G. 14
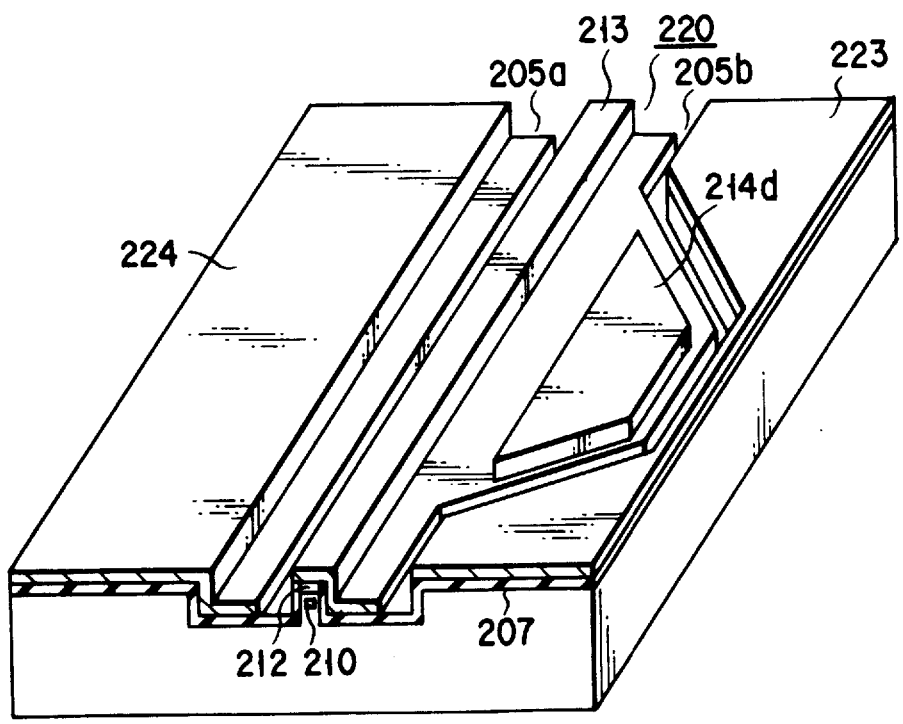
F I G. 15

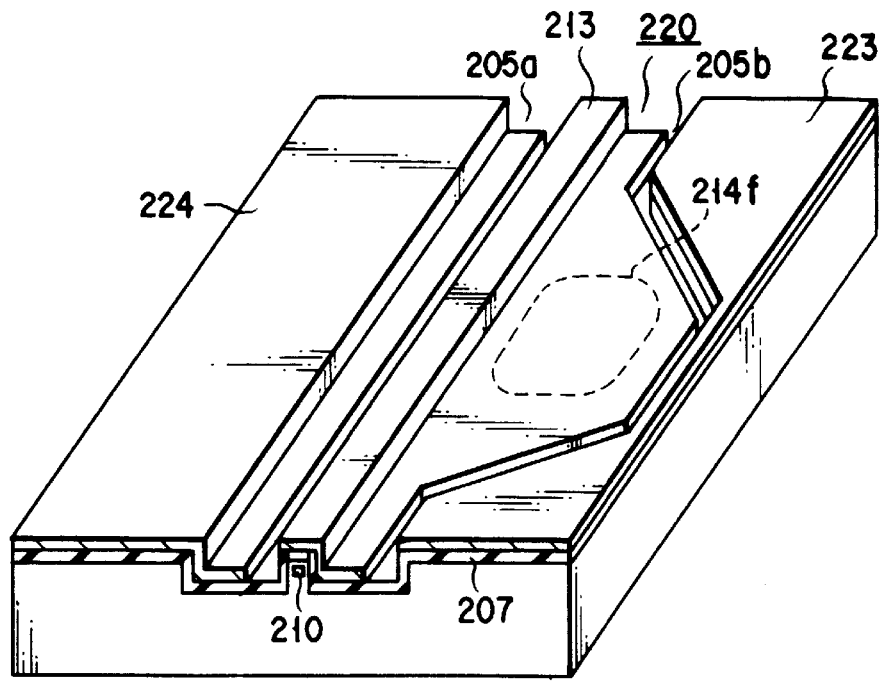
F I G. 20
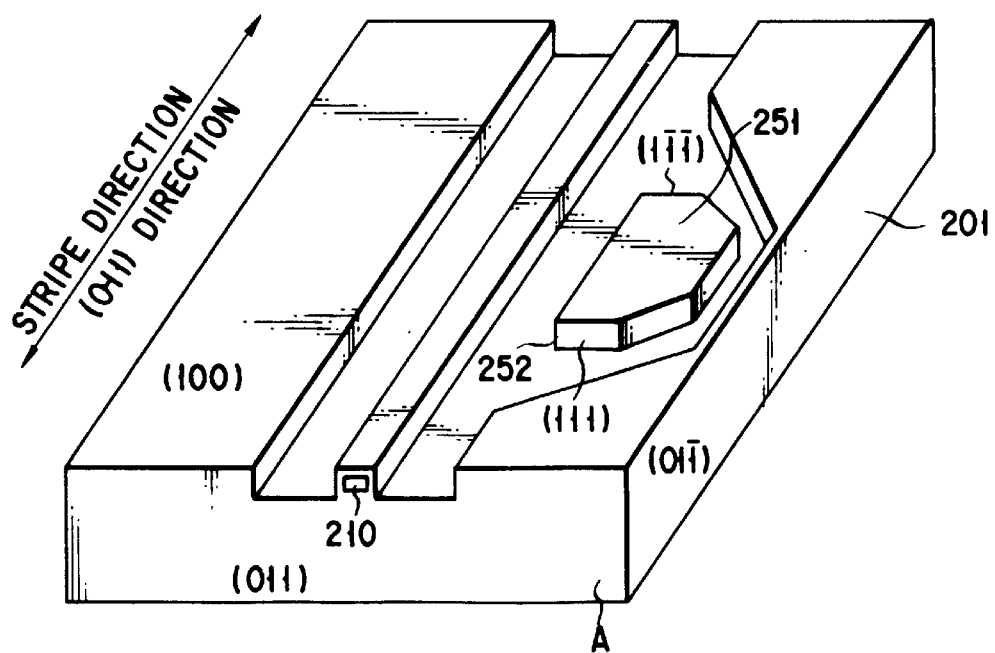
F I G. 21

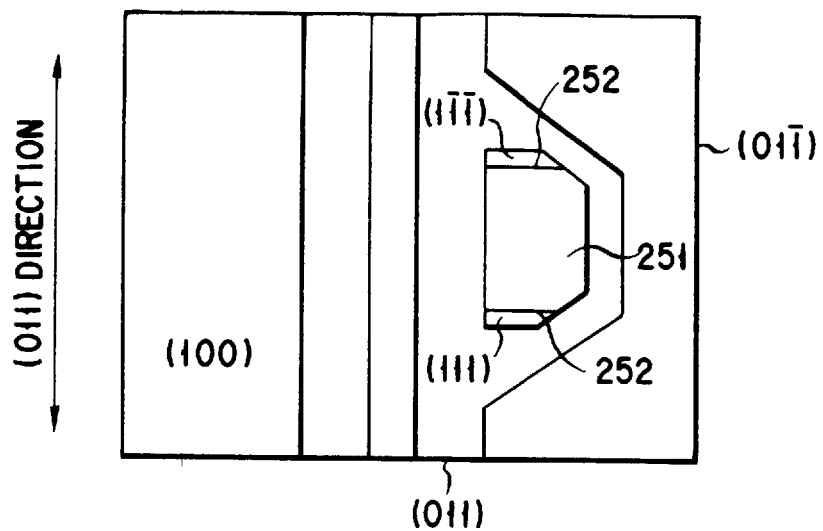
F I G. 22
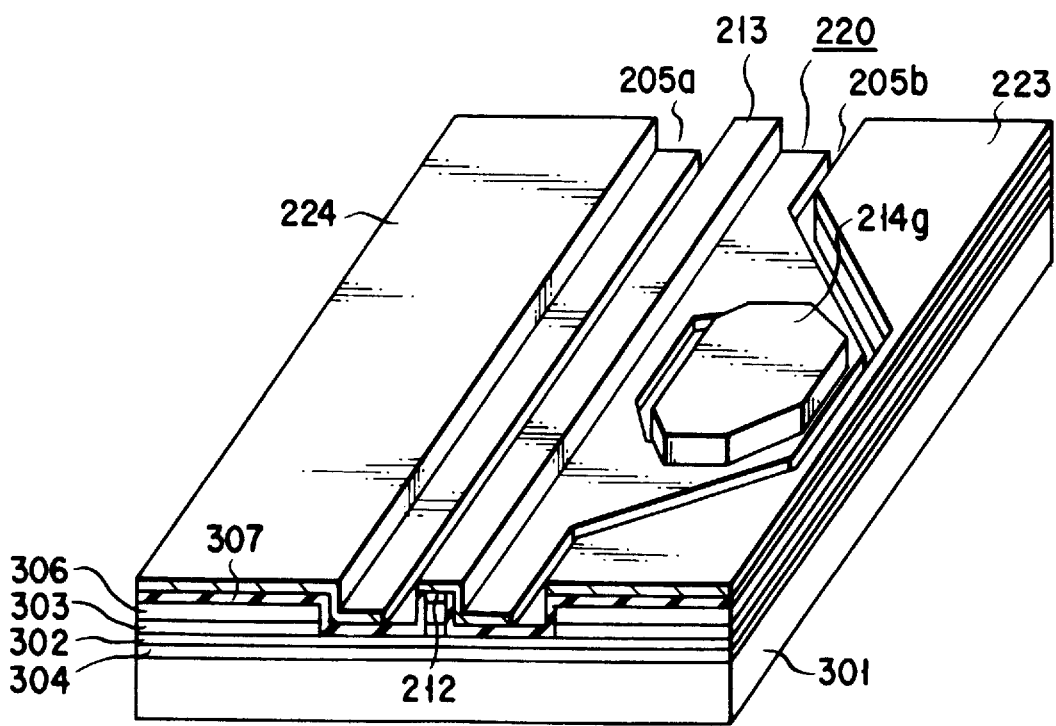
F I G. 23

SEMICONDUCTOR DEVICE AND METHOD FOR MANUFACTURING THE SAME

This is a division of application Ser. No. 08/571,407 filed Dec. 13, 1995, U.S. Pat. No. 5,683,937.

BACKGROUND OF THE INVENTION

1. Field of the Invention

This invention relates to a semiconductor device, and more particularly to the electrode structure of a semiconductor device having an irregular surface and a method for manufacturing the same.

2. Description of the Related Art

A semiconductor device is formed to have an irregular surface on the semiconductor substrate in many cases. For example, in a semiconductor laser, the electrode portion for supplying a current to a semiconductor active layer is formed in a stripe form on the active layer and the BH structure (Buried Hetero structure) is known as the electrode structure. The semiconductor laser of the above structure sometimes utilizes a structure in which groove portions are formed on both sides of the stripe-form active layer to cut apart the current block layers formed on both sides of the active layer. With the above structure, a bonding pad portion connected to the anode is formed in addition to the stripe-form electrode portion and the bonding pad portion is connected to the electrode portion via a wiring film formed in the groove portion. Thus, the electrode portion of the semiconductor substrate is formed on the flat surface portion of the complicated structure having an irregular surface. Therefore, the electrode forming method makes it necessary to utilize complicated steps.

Next, the semiconductor laser with the conventional structure having the groove portion is explained with reference to FIGS. 1, 2 and 3A to 3E. FIGS. 1 and 2 are schematic perspective views of an InGaAsP/InP-series semiconductor laser for optical communication, and FIGS. 3A to 3E are cross sectional views showing the steps of the semiconductor laser manufacturing process in due order.

As shown in FIG. 1, a plurality of light emission areas/waveguides (active layers) 110 of stripe form are formed on an n-InP semiconductor substrate 101 by the crystal growth. As the growth method, the LPE method (Liquid Crystal Epitaxy), MOCVD method (Metal-Organic Chemical Vapor Deposition) or the like is used and the above method is also used to form the following compound semiconductor layer. The active layer 110 is formed of undoped InGaAsP-series compound semiconductor. On both sides of the active layer 110, n-type InP layers (not shown) acting as current block layers and upper and lower p-type InP clad layers (not shown) disposed on the upper and lower surfaces of the current block layers are formed by the crystal growth. Part of the stacked body containing the current block layer is separated from the active layer 110 by means of stripe-form groove portions 105. The groove portions 105 are formed such that parts of the stacked body will be left behind on both sides of the active layer 110.

A p-type InGaAs contact layer (not shown) is formed on the upper p-type InP clad layer. The grooves are formed on both sides of the active layer 110 to construct a mesa structure. Since the groove portions 105 are formed such that parts of the stacked body will be left behind on both sides of the active layer 110, the mesa structure is formed with the active layer disposed between the parts of the stacked body. The surface of the semiconductor substrate 101 except the surface of the electrode portion is covered with an $SiO_2$ insulative film 107. Further, stripe-form ohmic contact electrodes (AuZn) 112 for current injection are formed to cover the upper surfaces of the respective active layers 110.

As shown in FIG. 2, the ohmic contact electrode 112 is formed to cover the above structure and a lead-out electrode (Ti/Pt/Au) 113 for electrical connection is formed. Further, a bonding pad (Ti/Pt/Au) 114 is formed on the surface of the semiconductor substrate 101 by the vacuum deposition method. The lead-out electrode 113 and the bonding pad 114 are electrically connected to each other via a wiring formed on the internal portion of the groove portion 105 in the surface of the semiconductor substrate 101. Therefore, the lead-out electrode 113, bonding pad 114 and the wiring for electrically connecting them together are integrally formed and construct an element electrode as a whole.

Next, a method of manufacturing the above-described semiconductor laser device by use of the photolithography is explained with reference to FIGS. 3A to 3E. FIG. 3A is a cross sectional view taken along the 3A—3A line of FIG. 1. In FIG. 3A, the active layers, clad layers, current block layers and groove portions are already formed in the semiconductor substrate 101 and the stripe-form electrodes 112 for current injection are formed to cover the upper surface of the stripe-form active layers. An area of the main surface of the semiconductor substrate 101 except a portion in which the above electrode is formed is covered with an $SiO_2$ insulative film 107 (FIG. 3A).

A metal film 116 formed of a stacked film of Ti/Pt/Au is uniformly formed on the entire portion of the main surface of the semiconductor substrate 101 by the vacuum deposition method. In this case, the electron beam vapor-deposition method of high directivity is used. An electrode material is deposited on the main surface of the semiconductor substrate 101 by use of an electron beam vapor-deposition system and the metal film 116 is deposited. Since the groove portions 105 are formed in the main surface of the semiconductor substrate 101 and stepped portions are formed, the electron beam vapor-deposition system having a rotation and revolution (planetary) mechanism is used to uniformly deposit the metal film also on the side portions of the stepped portions.

That is, the main surface of the semiconductor substrate which is a to-be-processed object is set to face the vapor-deposition source of the electron beam vapor-deposition system at an adequate tilt angle so that metal particles will be applied to the main surface of the substrate in a direction indicated by the arrow 115. Further, as shown in FIG. 3B, metal particles can be applied to and vapor-deposited on the main surface of the substrate in every directions by revolving the semiconductor substrate 101 in the B direction around a rotation axis (not shown) which is separated from and set in parallel to the rotation axis Y—Y passing substantially the center of the substrate and lies outside the substrate while rotating the semiconductor substrate 101 around the rotation axis Y—Y in the A direction. By the above method, the metal film 116 is uniformly deposited. Breakage of the metal film on the shoulder portion of the stepped portion can be prevented by using the electron beam vapor-deposition system having a rotation and revolution mechanism.

Next, a photoresist 117 is coated on the semiconductor substrate 101 to prevent breakage of the metal film on the shoulder portion of the stepped portion. Then, a photomask 118 is disposed on an area in which electrodes on the semiconductor substrate 101 are formed and ultraviolet rays 119 are applied to the photoresist 117 via the photomask to expose the photoresist and thus pattern the photoresist 117 (FIGS. 3C, 3D).

Next, the metal film 116 is etched with the patterned photoresist 117 used as a mask so as to form an electrode 120 formed of the stacked film of Ti/Pt/Au (FIG. 3E). The electrode is constructed by an electrode portion 113 for current injection, a bonding pad portion 114 for connecting a bonding wire for transferring a signal from the other circuit or semiconductor element to the semiconductor device, and a wiring portion for connecting the above portions together. Finally, the photoresist is removed to complete the semiconductor device as shown in FIG. 2. FIG. 3E is a cross sectional view taken along the 3E—3E line of FIG. 2.

In the above electrode forming method, the resist is formed in the electrode forming area after the metal film has been formed on the entire surface of the substrate and then an unnecessary portion of the metal film is removed by etching with the resist used as a mask. In the other electrode forming method, it is possible to vapor-deposit a metal film on the entire surface of the substrate by removing the resist on the electrode forming portion after the resist has been formed on the entire surface of the substrate, and applying metal particles in oblique directions while rotating and revolving the substrate. In this case, the unnecessary portion of the metal film is simultaneously removed by mechanically separating the resist after deposition of the metal film (lift-off method).

The thus constructed conventional semiconductor laser has the following problem in the structure and method.

1) In a case where the surface of the semiconductor substrate is made irregular, it is required to rotate and revolve the semiconductor substrate while it is held at an adequate tilt angle as described before in order to form the electrode along the irregular portion of the semiconductor substrate by the vapor-deposition method. To meet the requirement, a complicated special mechanism must be provided on the vacuum deposition device which is originally simple in construction.

2) Even if the vacuum deposition method of rotation and revolution type can be attained without using the special mechanism, the photolithography process effected for the substrate surface having a complicated irregular surface portion tends to cause a problem of breakage of a wire at the shoulder portion of the irregular surface portion of the photoresist and it is not a simple method.

3) Further, in a case where the vacuum deposition method of rotation and revolution type is effected, a difficult technique of forming the resist in a multilayered structure and making the resist thick is required in order to effect the lift-off method or the like.

The above problems 1) to 3) make it necessary to add the difficult technique to the photolithography process or vacuum deposition method which is originally a simple method. Addition of the difficult technique makes it difficult to manufacture the device in a simple construction on an experimental basis. Further, in the case of mass production, problems that the construction of the semiconductor manufacturing device is complicated, the number of process is increased, the yield is lowered and the like will occur.

SUMMARY OF THE INVENTION

An object of this invention is to provide a semiconductor device capable of attaining the connection or disconnection between the electrode and the other conductive area by use of a simple method without adding a complicated step when the electrode is formed on the main surface of a semiconductor substrate having an irregular surface portion and a method for manufacturing the semiconductor device.

In order to attain the above object, a semiconductor device of this invention comprises a rectangular semiconductor chip having a main surface; a stripe-form semiconductor element forming portion formed in parallel to one of sides of the semiconductor chip to cross the main surface; a first groove portion formed along one of sides of the semiconductor element forming portion in a longitudinal direction; a second groove portion formed along the other of the sides of the semiconductor element forming portion in the longitudinal direction, the second groove portion including a hollow space which is enlarged in substantially a central portion; a surface electrode formed on at least part of an upper portion of the semiconductor element forming portion; an external lead connecting terminal electrode formed in the hollow space; a wiring including at least a portion formed on part of a bottom surface of the second groove portion and that one of side surfaces of said second groove portion which is adjacent to the semiconductor element forming portion, for electrically connecting the surface electrode to the terminal electrode; a first dummy electrode formed at least on the main surface of the semiconductor chip to face the semiconductor element forming portion with the first groove portion disposed therebetween; and a second dummy electrode formed on the main surface of the semiconductor chip to face the semiconductor element forming portion with the second groove portion including the hollow space disposed therebetween.

The surface electrode is disconnected from the first dummy electrode at least at that one of side surfaces of the first groove portion which is adjacent to the stripe-form semiconductor element forming portion, and the second dummy electrode is disconnected from the wiring at least at that one of the side surfaces of the second groove portion which is adjacent to the second dummy electrode.

The semiconductor device may further include a mesa projecting portion formed in the hollow space and having a side surface on which the wiring is formed to extend, and the terminal electrode may be formed on an upper surface of the projecting portion and connected to the surface electrode via the wiring which is formed to extend on the side surface of the projecting portion. In this case, it is preferable in view of the reliability of the wire bonding if the upper surface of the projecting portion is made flush with the main surface of the chip.

The projecting portion may be formed to have a side which is perpendicular to the longitudinal direction of the semiconductor element forming portion and an inclined surface extending to an exterior of the projecting portion towards the bottom surface of the second groove portion from the side and the wiring may be formed on the inclined surface. Connection between the terminal electrode and the surface electrode can be attained with high reliability by use of the wiring formed on the inclined surface. The side surface of the projecting portion except a portion in which the inclined surface is formed may have a side surface formed to inwardly or vertically extend from an edge portion of the upper surface of the projecting portion.

The semiconductor element forming portion may be formed to include a branch portion extending in a direction towards the hollow space included in the second groove portion, the branch portion may be formed to have a side which is perpendicular to the longitudinal direction of the semiconductor element forming portion and an inclined surface extending to an exterior of the branch portion towards the bottom surface of the second groove portion from the side and the wiring may be formed on the inclined surface. Connection between the terminal electrode and the surface electrode can be attained with high reliability by use of the wiring formed on the inclined surface. The side surfaces of the semiconductor element forming portion except a portion in which the branch portion is formed may have side surfaces formed to inwardly or vertically extend from edge portions of the upper surface of the semiconductor element forming portion.

The side surface of the area in which the first and second dummy electrodes are formed in the first and second groove portions may be formed to have a side surface formed to inwardly or vertically extend from the edge portion of the upper surface of the area so as to stably isolate the wiring.

It is preferable to construct the side surface of the second dummy electrode forming area which faces the semiconductor element forming portion only by a side surface parallel to the longitudinal direction of the semiconductor element forming area and a side surface facing the side surface of the semiconductor element forming area in the longitudinal direction at a tilt angle. Typically, the plane shape of the hollow space is preferably formed by a trapezoid formed to have a side formed in connection with a longitudinal part of the second groove portion along the stripe-form semiconductor element forming portion as a bottom side and an upper side shorter than the bottom side which is positioned on a side of the second dummy electrode.

The stripe direction of the semiconductor element forming area suitably formed with the above structure is a (011) direction.

A method for manufacturing the above semiconductor device comprises a step of forming a plurality of concave portions to define a plurality of island regions on a main surface of a semiconductor substrate; and a step of simultaneously forming a plurality of isolated conductive regions by applying a conductive material in an oblique direction from above the main surface of the semiconductor substrate to the main surface by a vacuum deposition method of high directivity and depositing a conductive material on areas of the substrate except portions of the substrate which lie on the concave portions and are masked from the application of the conductive material.

Typically, one of the plurality of island regions is a stripe-form semiconductor element forming area.

The conductive region forming step includes a step of simultaneously forming an external lead connecting terminal electrode, which is integrally connected to one of the conductive regions formed in the stripe-form island region, in one of the plurality of concave portions which is adjacent to the stripe-form island region on the side from which the conductive material is applied in order to form the plurality of conductive regions.

The island region forming step includes a step of forming a mesa projecting portion for connection with an external lead in one of the plurality of concave portions adjacent to the stripe-form island region on the side from which the conductive material is applied in order to form the plurality of conductive regions, and the conductive region forming step includes a step of forming the external lead connecting terminal electrode on the mesa projecting portion.

The projecting portion forming step includes a step of forming a first inclined surface outwardly extending from an edge portion of an upper surface of the projecting portion towards a bottom surface of the concave portion, and the conductive region forming step includes a step of forming a first wiring of the conductive material on the first inclined surface.

The island region forming step includes a step of forming a branch portion of the stripe-form island region having at least one side projecting towards one of the concave portions in which the terminal electrode is formed, the branch portion having a second inclined surface which outwardly extends from the at least one side towards the bottom surface of the concave portion, and the conductive region forming step includes a step of forming a second wiring of the conductive material on the second inclined surface.

The vacuum deposition method preferably utilizes an electron beam deposition method.

Further, another method for manufacturing the semiconductor device of this invention comprises a step of forming a plurality of concave portions to define a plurality of island regions on the main surface of a semiconductor substrate, the concave portion forming step including a step of selectively forming inclined surfaces respectively extending inwardly and outwardly from edge portions of the upper surface of the island region towards a bottom surface of the concave portion; and a step of simultaneously forming a plurality of isolated conductive regions by applying a conductive material from above the main surface of the semiconductor substrate to the main surface by a vacuum deposition method of high directivity to deposit the conductive material, in areas of the substrate except portions of the substrate which lie on the concave portions and are masked from the application of the conductive material, the step of forming the plurality of conductive regions including a step of selectively connecting one of the conductive regions formed in the island regions to one of the conductive regions formed in the concave portions via one of the plurality of conductive regions formed on the inclined surface.

One of the plurality of island regions is a stripe-form semiconductor element forming area having a branch portion, the branch portion has an inclined surface which outwardly extends from an edge portion of the upper surface thereof towards the bottom surface of the concave portion, the stripe-form semiconductor element forming area has an inclined surface which inwardly extends from an edge portion of the upper surface thereof towards the bottom surface of the concave portion, and the conductive region formed on the stripe-form area is connected to the conductive region formed in the adjacent one of the concave portions via the conductive region formed on the outwardly extending inclined surface of the branch portion.

An external lead connecting terminal electrode integrally connected to the conductive region formed in the stripe-form semiconductor element forming area may be simultaneously formed in one of the plurality of concave portions adjacent to the stripe-form element forming area.

The island region forming step includes a step of forming a mesa projecting portion for connection with the external lead in one of the plurality of concave portions adjacent to the stripe-form semiconductor element forming area, the mesa projecting portion has an inclined surface outwardly extending from the edge portion of the upper surface of the projecting portion towards the bottom surface of the concave portion, and the conductive region forming step forms the external lead connecting terminal electrode on the mesa projecting portion, the terminal electrode being connected to the conductive region formed in the concave portion via the conductive region formed on the outwardly extending inclined surface of the mesa projecting portion.

As described above, the electrode and wiring of the semiconductor device can be isolated in a self-alignment manner by designing the device such that a surrounding portion which is desired[]to be isolated will be optically masked by the irregularity of the surface of the semiconductor substrate. Further, since the wiring connection can be easily made by forming an inclined surface on the boundary portion between the convex and concave portions of the main surface of the semiconductor substrate, it becomes possible to easily perform the wiring on the semiconductor substrate having an irregular surface by a method which does not require a complicated photolithography method and a rotation and revolution type deposition device described before. Further, if the dummy electrode is formed flush with the bonding pad, the adhesion to the substrate surface is enhanced when the substrate surface is mechanically masked in the later processing step, thus making it possible to prevent a bad influence by the processing step from being given to the bonding pad surface.

Further, if a preset pattern is formed on the main surface of (100) plane of the semiconductor substrate by use of a mask by the wet etching of HCl, it is possible to easily form an inclined surface of (1/1/1) plane or (111) plane or inclined surfaces of (1/1/1) plane and (111) plane on the side surface perpendicular to a side of the convex portion (stripe portion) in the (011) direction formed on the main surface. In this case, "/" in the (1/1/1) plane or the like indicates a bar attached to the top of "1". This also applies to the following description.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a schematic perspective view of a semiconductor laser element according to a first embodiment of this invention;

FIG. 5 is a cross sectional view of an enlarged portion indicated by a reference numeral 5 in FIG. 1;

FIGS. 6 to 8 are perspective views of the substrate in the sequential steps of a substrate manufacturing method of the first embodiment;

FIG. 14 is a schematic perspective view of a semiconductor laser substrate according to a third embodiment of this invention;

FIG. 15 is a schematic perspective view of a semiconductor laser element having an electrode formed on the laser substrate of FIG. 14;

FIG. 20 is a schematic perspective view of a semiconductor laser element having an electrode formed on the laser substrate of FIG. 15;

FIG. 21 is a perspective view indicating the crystal orientations of the laser substrates used in the embodiments of this invention;

FIG. 22 is a plan view indicating the crystal orientations of the laser substrates used in the embodiments of this invention; and FIG. 23 is a schematic perspective view of a semiconductor laser element according to a sixth embodiment of this invention.

DETAILED DESCRIPTION OF THE PREFERRED EMBODIMENTS

Figure 1:
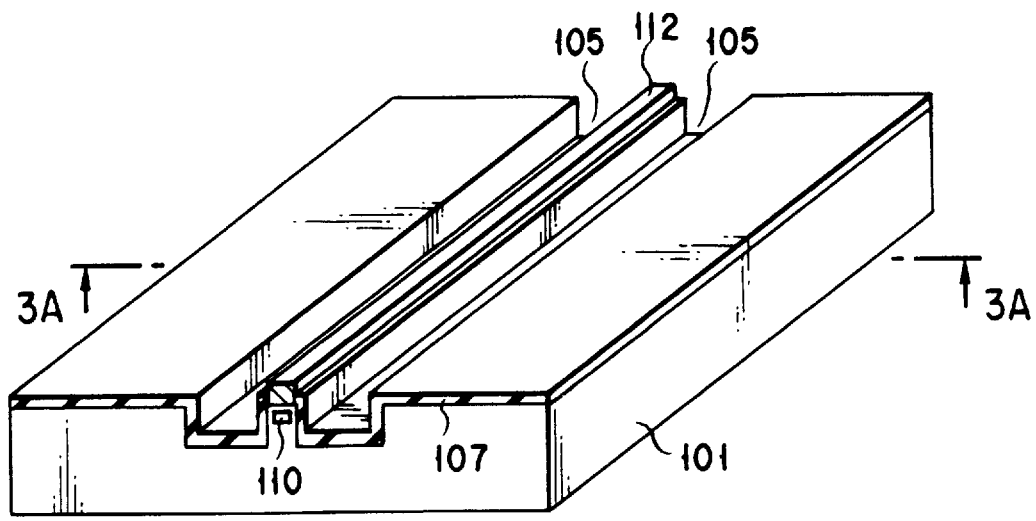
FIG. 1 is a schematic perspective view of a conventional semiconductor laser substrate.
Figure 2:
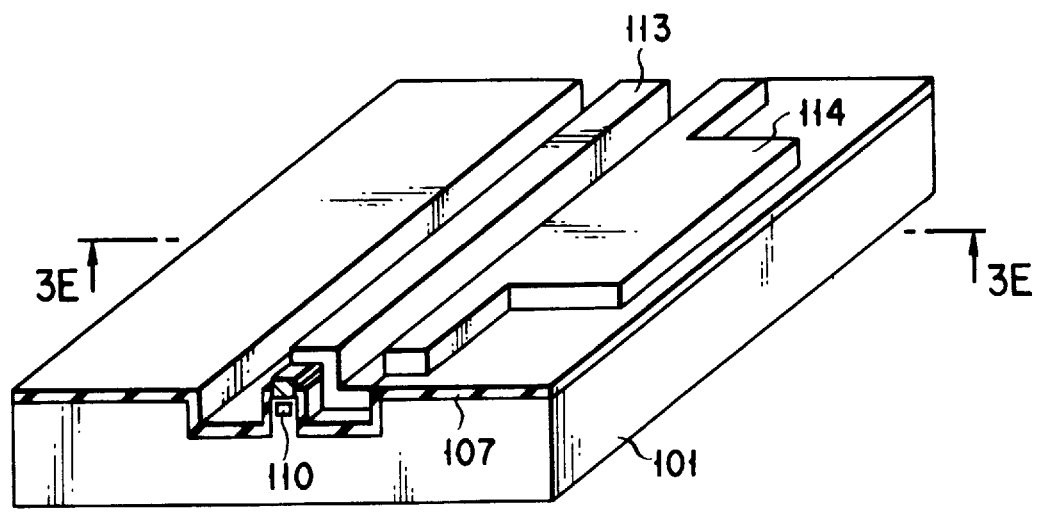
FIG. 2 is a schematic perspective view of a semiconductor laser element having an electrode formed on the laser substrate of FIG. 1.
Figure 3A:
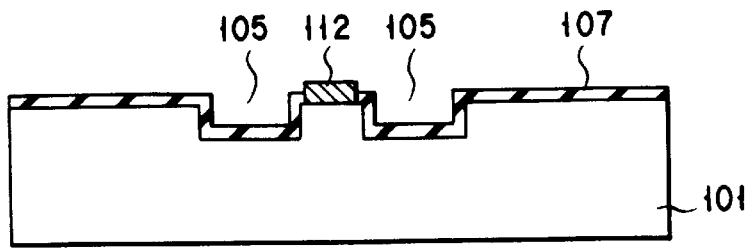
FIGS. 3A to 3E are cross sectional views of the laser device in the sequential steps of a method for manufacturing the conventional semiconductor laser element.
Figure 3B:
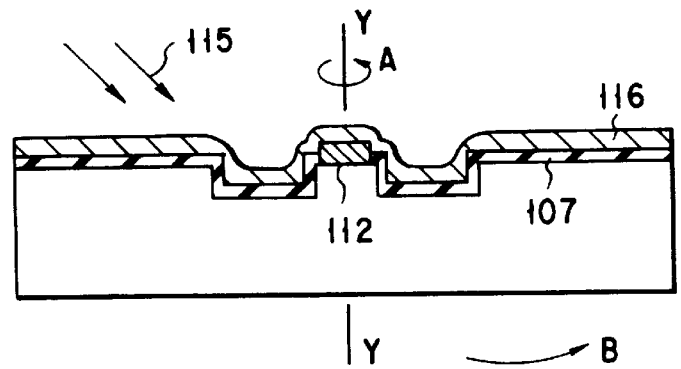
Figure 3C:
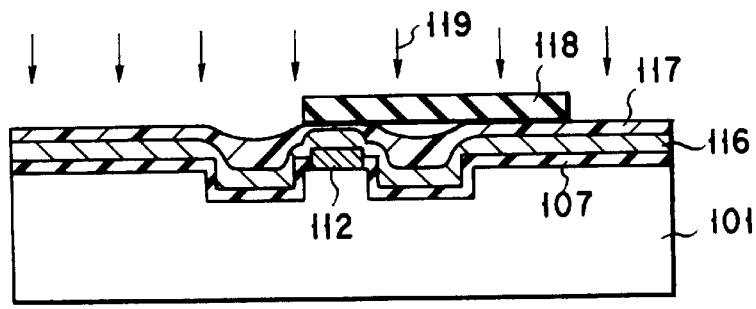
Figure 3D:
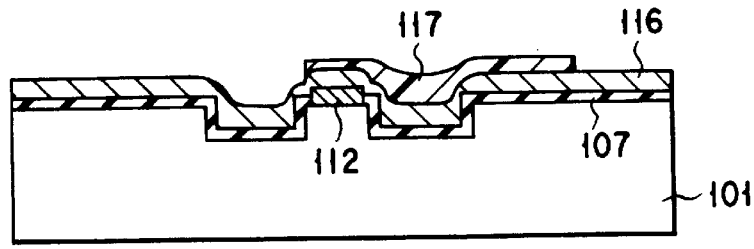
Figure 3E:
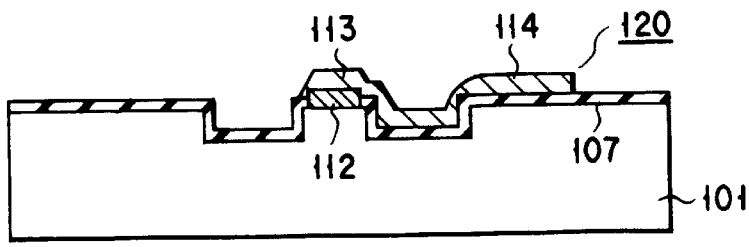

There will now be described an embodiment of this invention with reference to the accompanying drawings. Like parts are denoted by the same reference numerals throughout the following embodiments and the explanation therefor is omitted.

Embodiment 1

First, the first embodiment is explained with reference to FIGS. 4 to 9A, 9B. The embodiment shows the basic structure of this invention.

FIG. 4 is a schematic perspective view of an InGaAsP/InP-series semiconductor laser for optical communication. As shown in FIG. 4, a light emission area/waveguide (active layers) 210 of stripe form is formed on an n-InP semiconductor substrate 201 by the crystal growth. As the growth method, the LPE method, MOCVD method or the like is used and the method is used to form the following compound semiconductor layer.

The active layer 210 is formed of undoped InGaAsP-series compound semiconductor, for example. On each side of the active layer 210, an n-type InP layer 202 acting as a current block layer and upper and lower p-type InP clad layers 203 and 204 disposed on the upper and lower surfaces of the current block layer are formed by the crystal growth as shown in FIG. 5 indicating an enlarged portion of a portion indicated by a reference numeral 5 of FIG. 4.

Figure 7:
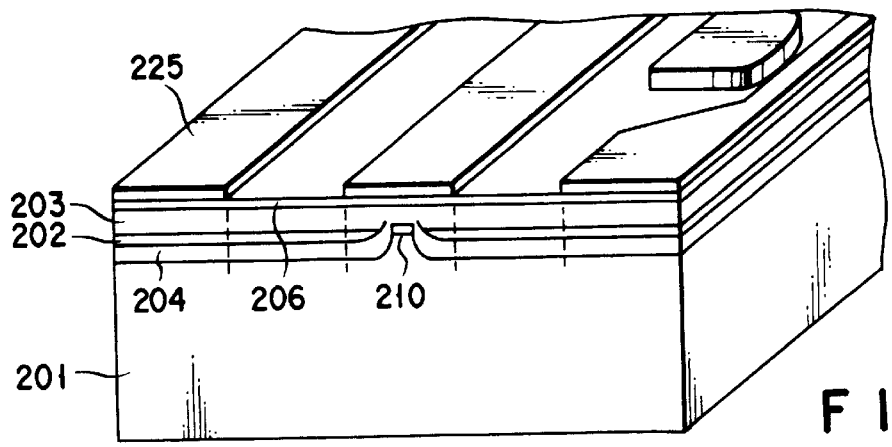

Part of the stacked body containing the current block layer 202 is separated from the active layer 210 by means of stripe-form groove portion 205a, 205b. As shown in FIG. 7, the groove portions 205a and 205b are formed such that parts of the stacked body will be left behind on both sides of the active layer 210. A p-type InGaAs contact layer 206 is formed on the p-type InP clad layer 203 (FIG. 5).

The grooves 205a, 205b are formed on both sides of the active layer 210 to construct a mesa structure. Since the groove portions 205a, 205b are formed such that parts of the stacked body will be left behind on both sides of the active layer 210 as described before, the mesa structure is formed with both side surfaces of the active layer surrounded by parts of the stacked body. A wide hollow space is formed in the groove portion 205b which is one of the groove portions formed on both sides of the active layer 210 and a mesa projecting portion for bonding pad is formed in the hollow space. In this embodiment, the plane shape of the mesa projecting portion is freely determined.

The surface of the semiconductor substrate 201 except the surface of the electrode portion is covered with an $SiO_2$ insulative film 207. Further, an ohmic contact electrode (AuZn) 212 for current injection is formed in a stripe form to cover the upper surface of the active layer 210. A surface electrode (Ti/Pt/Au) 213 is formed to cover the ohmic contact electrode 212 and to be electrically connected therewith.

Further, a bonding pad (Ti/Pt/Au) 214a is formed on a projecting portion which is formed in the wide hollow space of the groove portion 205b on the surface of the semiconductor substrate 201 by the vacuum deposition method. The surface electrode 213 and the bonding pad 214a are electrically connected to each other via a wiring formed on the internal surface of the groove portion 205b formed in the surface area of the semiconductor substrate 201. Therefore, the surface electrode 213, bonding pad 214a and the wiring for electrically connecting them together are integrally formed and construct an element electrode 220 as a whole.

Dummy electrodes 223, 224 are formed in addition to the element electrode 220 on the main surface of the semiconductor substrate 201 having irregular surface portions and the electrodes cover substantially the entire portion of the main surface. The dummy electrode 223 is isolated from the element electrode 220 in the bottom portion of the groove portion 205b having the wide hollow space. This is because a conductive material is not deposited on the boundary portion between the area in which the dummy electrode 223 is formed and the groove portion (hollow space) 205b as will be described later. The side surface of the dummy electrode which faces the surface electrode 213 is constructed by a side which is in parallel to or oblique with respect to the electrode 213 and does not have a side which is perpendicular to the extending direction of the electrode 213. The reason for this is explained later.

The side surface of the dummy electrode 224 is formed in parallel to the side surface of the surface electrode 213 with the groove portion 205a disposed therebetween, and the dummy electrode 224 terminates at least at the bottom portion of the groove portion 205a and is isolated from the element electrode 220. This is because a conductive material is not deposited on the boundary portion between the groove portion 205a and the stripe-form convex portion containing the active layer 210. The electrodes 220, 223, 224 are formed of the same metal film (Ti/Pt/Au film). Since the dummy electrodes 223, 224 are made flush with the bonding pad, a masking material can be strongly attached to the substrate surface when the masking material is attached in the later processing step, thereby making it possible to prevent the bonding pad surface from being influenced by entrance of chemical or the like.

Next, a method of forming the electrodes on the semiconductor substrate is explained with reference to FIGS. 6 to 9A, 9B. An electron beam heating vacuum-deposition system of high directivity is used to deposit metal for the electrodes on the semiconductor substrate. The system is a deposition system utilizing the electron beam heating and striking process for applying an electron beam to a deposition material and heating and vaporizing the material.

The buried active layer 210 is formed in the n-InP-series semiconductor substrate 201, and the current block layers 202 and the upper and lower clad layers 203, 204 which are disposed on the upper and lower sides of the respective current block layers are formed on both sides of the active layer 210 by the crystal growth. The p-type contact layer 206 is formed on the upper surface of the p-type clad layer 203 (FIG. 6).

Next, as shown in FIG. 7, a photoresist 225 of preset pattern is formed on the main surface of the semiconductor substrate 201. The photoresist 225 is formed by transferring a design pattern which is designed such that a portion in which the electrode is desired to be isolated will be optically masked and a portion in which a continuous electrode wiring is desired to be formed will not be optically masked.

Next, the main surface of the semiconductor substrate is subjected to the wet etching with the photoresist 225 used as a mask. The p-type contact layer 206 is selectively etched out by use of an etchant for selectively removing the contact layer, for example, a solution ($H_2SO_4:H_2O_2:H_2O=4:1:1$) or solution ($HCl:CH_3COOH:H_2O=1:2:1$) and the current block layer and clad layer are etched by HCl which is an etchant with the contact layer 206 used as a mask to form the groove portions 205a, 205b on both sides of the stripe-form active layer 210. By the two groove portions 205a, 205b, the surface portion of the semiconductor substrate 201 is separated into three island regions 271, 272, 273.

The etching process is effected with the contact layer 206 used as a mask and the exposed portions of the stacked body are etched out along the broken lines indicated in FIG. 7. Generally, the etching process is effected until the p-type clad layer 204 is removed, but it is possible to etch out the clad layer 204 to the total thickness thereof and slightly etch the surface portion of the semiconductor substrate 201. The wide hollow space is formed in the groove portion 205b and a projecting portion 251a is formed in the hollow space (FIG. 8).

An ohmic contact electrode (AuZn) 212 which is an electrode for current injection is formed on the p-type contact layer which is formed on the active layer 210. In an area in which the electrode 212 for current injection is not formed, for example, an insulative film 207 of $SiO_2$ is formed by the CVD (Chemical Vapor Deposition) method or the like. An electrode such as a terminal electrode is formed on the above insulative film.

Figure 8:
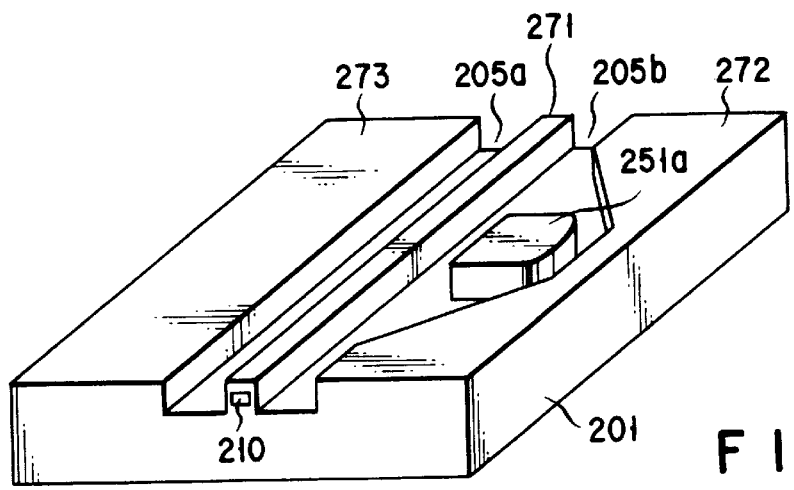

The exposed surface of the active layer of the semiconductor laser of this embodiment and the surface thereof opposite to the exposed surface construct a resonant surface, but since the semiconductor layers shown around the resonant surface in FIG. 8 and in the succeeding drawings are the same in structure, layers other than the active layer are not shown in the drawing if they are not particularly necessary.

Figure 9A:
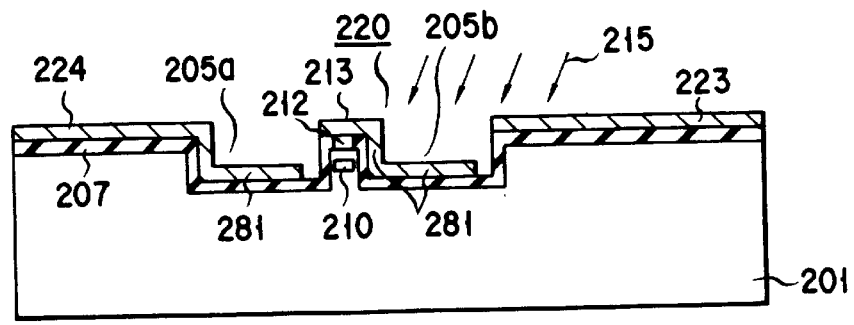
FIGS. 9A and 9B are cross sectional views taken along the lines 9A—9A and 9B—9B of FIG. 4, for illustrating the electrode forming method in the first embodiment.
Figure 9B:
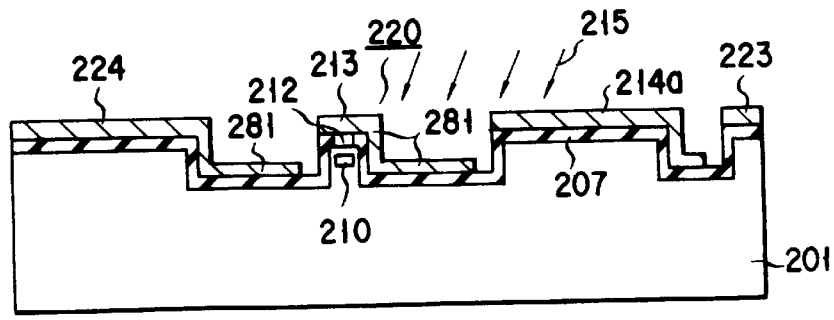

Next, as shown in FIGS. 9A, 9B, metal particles are applied in a direction of arrow 215 and deposited on the main surface of the semiconductor substrate 201 on which the insulative film 207 and the electrodes 212 for current injection are formed. The metal particles are applied to the entire portion of the main surface of the semiconductor substrate 201. In this example, the direction of application of the metal particles is set to a direction from the upper right to the lower left in the drawing. The directivity of the metal particles emitted from the electron beam heating and depositing device is high, and the rotation and revolution mechanism must be used in the prior art in order to uniformly deposit the metal particles, but in this invention, separation and connection of the electrode wiring can be easily attained in a self-alignment manner by utilizing the directivity and the irregularity of the main surface of the semiconductor substrate on which metal particles are deposited. FIGS. 9A and 9B are cross sectional views taken along the lines 9A—9A and 9B—9B of FIG. 4.

For example, if metal particles are applied to the semiconductor substrate in the direction 215 as shown in the drawing, the convex portion on which the right side dummy electrode 223 is formed acts as a barrier to prevent the metal particles from being deposited on a portion near the side surface of the groove portion 205b adjacent thereto. Therefore, the element electrode 220 formed on the bottom surface of the groove portion 205b is isolated from the dummy electrode 223. On the other hand, the side surface of the groove portion 205b opposite to the above side surface is exposed to the metal particles and the metal particles are deposited on the opposite side surface to form a wiring 281. The element electrode 220 is constructed by the surface electrode 213, bonding pad 214a and the wiring 281 for connecting them together and the surface electrode 213 and the bonding pad 214a are electrically connected together with high reliability via the wiring formed on the side surface.

The application angle of metal particles applied in an oblique direction from above the semiconductor substrate 201 with respect to a normal to the substrate can be freely set to a desired value. If the angle with respect to the normal is small, the area of deposition of the metal particles applied to the semiconductor substrate becomes large, thereby making the separation distance between the element electrode 220 and the dummy electrode 223 short. On the other hand, if the angle is larger, the separation distance becomes longer.

Embodiment 2

Next, the second embodiment is explained with reference to FIGS. 10, 11A, 11B. This embodiment has a feature in the shape of the bonding pad.

Figure 10:
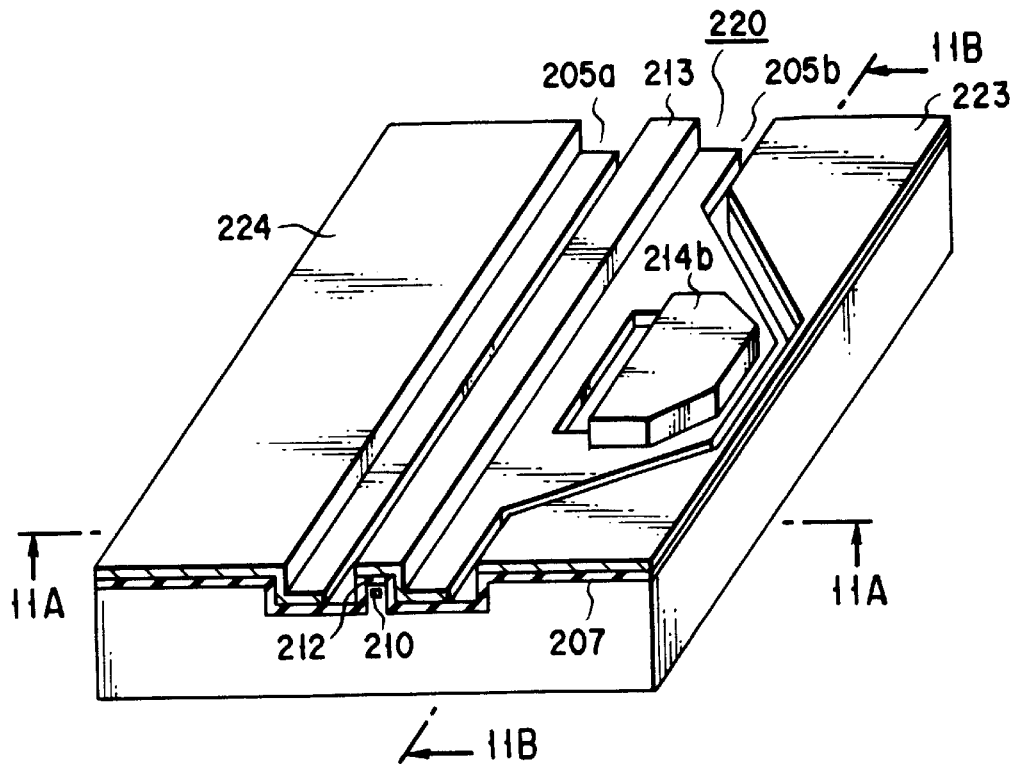
FIG. 10 is a schematic perspective view of a semiconductor laser element according to a second embodiment of this invention.
Figure 11A:
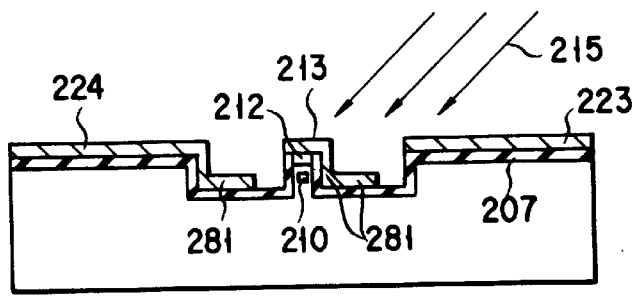
FIGS. 11A and 11B are cross sectional views taken along the lines 11A—11A and 11B—11B of FIG. 10, for illustrating the electrode forming method in the second embodiment.
Figure 11B:
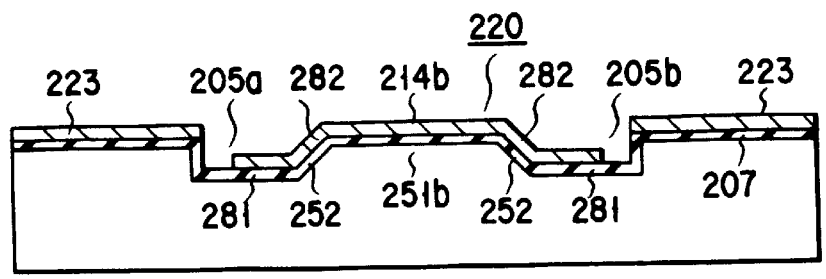

FIG. 10 is a schematic perspective view of an InGaAsP/InP-series semiconductor laser for optical communication, and FIGS. 11A and 11B are cross sectional views taken along the lines 11A—11A and 11B—11B of FIG. 10.

Stripe-form active layers 210 which are formed of, for example, undoped InGaAsP-series compound semiconductor are formed on an n-InP semiconductor substrate 201. On each side of the active layer 210, an n-type InP layer acting as a current block layer and upper and lower p-type InP clad layers disposed on the upper and lower surfaces of the current block layer are formed. Part of the stacked body containing the current block layer is separated from the active layer 210 by means of stripe-form groove portion 205a, 205b. Like the case of FIG. 7, the groove portions 205a and 205b are formed such that parts of the stacked body will be left behind on both sides of the active layer 210. A p-type InGaAs contact layer is formed on the p-type clad layer. The grooves 205a, 205b are formed on both sides of the active layer 210 to construct a mesa structure. Since the groove portions 205a, 205b are formed such that parts of the stacked body will be left behind on both sides of the active layer 210, the mesa structure is formed with both side surfaces of the active layer surrounded by parts of the stacked body.

A wide hollow space is formed in the groove portion 205b which is one of the groove portions formed on both sides of the active layer 210 and a projecting portion for bonding pad is formed in the hollow space. The surface of the semiconductor substrate 201 except the surface of the electrode portion is covered with an $SiO_2$ insulative film 207. Further, an ohmic contact electrode (AuZn) 212 for current injection is formed in a stripe form to cover the upper surface of the active layer 210.

In order to form the groove portions 205a, 205b, the same method used in the first embodiment is used. First, a photoresist of preset pattern is formed on the main surface of the semiconductor substrate 201. The photoresist is formed by transferring a design pattern which is designed such that a portion in which the electrode is desired to be isolated will be optically masked and a portion in which a continuous electrode wiring is desired to be formed will not be optically masked.

Next, the main surface of the semiconductor substrate is subjected to the wet etching with the photoresist used as a mask. Like the case of the first embodiment, the p-type contact layer is etched out by use of an etchant for selectively removing the contact layer, and the current block layer and clad layer are etched by HCl which is an etchant with the contact layer used as a mask to form the groove portions 205a, 205b on both sides of the stripe-form active layer 210, and the surface portion of the semiconductor substrate 201 is separated into three island regions corresponding to the formation areas for the electrodes 213, 223 and 224. A wide hollow space is formed in the groove portion 205b and a projecting portion 251b is formed in the hollow space (FIG. 11B).

In the above etching process, since the InP semiconductor substrate in which the main surface having the groove portions formed therein has a (100) plane is used as the semiconductor substrate, two inclined surfaces 252 having a (111) plane and (1/1/1) plane are formed on two side surfaces of the projecting portion 251b which is formed in a direction perpendicular to the stripe direction ((011) direction) of the active layer 210.

When the etching process is effected, a mask is formed on the projecting portion and the electrode forming area on the main surface, and in this state, the main surface is subjected to the wet etching process by use of an etchant such as HCl. Then, the side perpendicular to a direction other than the (011) direction in the side surfaces of the groove portions and the projecting portion 251b is etched in a vertical direction, but the side along the (01/1) direction, that is, a direction perpendicular to the stripe (lengthwise) direction is etched while the (111) plane or (1/1/1) plane is exposed. Therefore, the inclined surface 252 is formed on the side in a direction perpendicular to the stripe direction in the projecting portion 251b.

Thus, the etching characteristic differs according to the crystal structure, and when it is required to prevent an inclined surface from being formed on the side surface of the convex portion, it becomes necessary to prevent formation of a side in this direction. For this reason, in this invention, a side extending in a direction perpendicular to the stripe direction is not formed in the convex portion on which the dummy electrode 223 is formed. The reason is that if the dummy electrode has an inclined surface, it will be connected to the element electrode 220 via a metal film deposited on the inclined surface.

In order to deposit electrode metal on the semiconductor substrate, an electron beam system of high directivity is used to deposit metal particles on the main surface of the semiconductor substrate 201. The metal particles are applied to the entire portion of the main surface of the semiconductor substrate 201. The direction of application of the metal particles is set to a direction from the upper right to the lower left as indicated by the arrow 215 in FIGS. 9A, 9B. Since the directivity of the metal particles emitted from the electron beam system is high, separation and connection of the electrode wiring can be easily attained in a self-alignment manner by utilizing the directivity and the irregularity of the main surface of the semiconductor substrate on which metal particles are deposited.

For example, when metal particles are applied to the semiconductor substrate in a direction as indicated in the drawing, the convex portion on which the right side dummy electrode 223 is formed acts as a barrier to prevent the metal particles from being deposited on a portion near the side surface of the groove portion 205b adjacent thereto. Therefore, the element electrode 220 formed on the bottom portion of the groove portion 205b is isolated from the dummy electrode 223. On the other hand, the side surface of the groove portion 205b opposite to the above side surface is exposed to the metal particles and the metal particles are deposited on the opposite side surface to form a wiring 281.

The projecting portion 251b for bonding pad formed on the groove portion 205b has six sides and two inclined surfaces of (1/1/1) plane and (111) plane are formed on the side in a direction ((01/1) direction) perpendicular to the stripe direction ((011) direction) of the active layer 210. The inclined surface is exposed to the metal particles and the metal particles are deposited on the inclined surface to form a wiring 282. Therefore, in the element electrode 220, the bonding pad 214b is electrically connected to the wiring 281 mainly via the wiring 282 on the inclined surface. The reliability of connection can be enhanced in comparison with a case of connection made only via the vertical surface.

The dummy electrode is used for improvement of the adhesion of the mask and does not contribute to any connection between the elements or connection to the circuit. The electrodes 220, 223, 224 are formed of a Ti/Pt/Au film.

Figure 12:
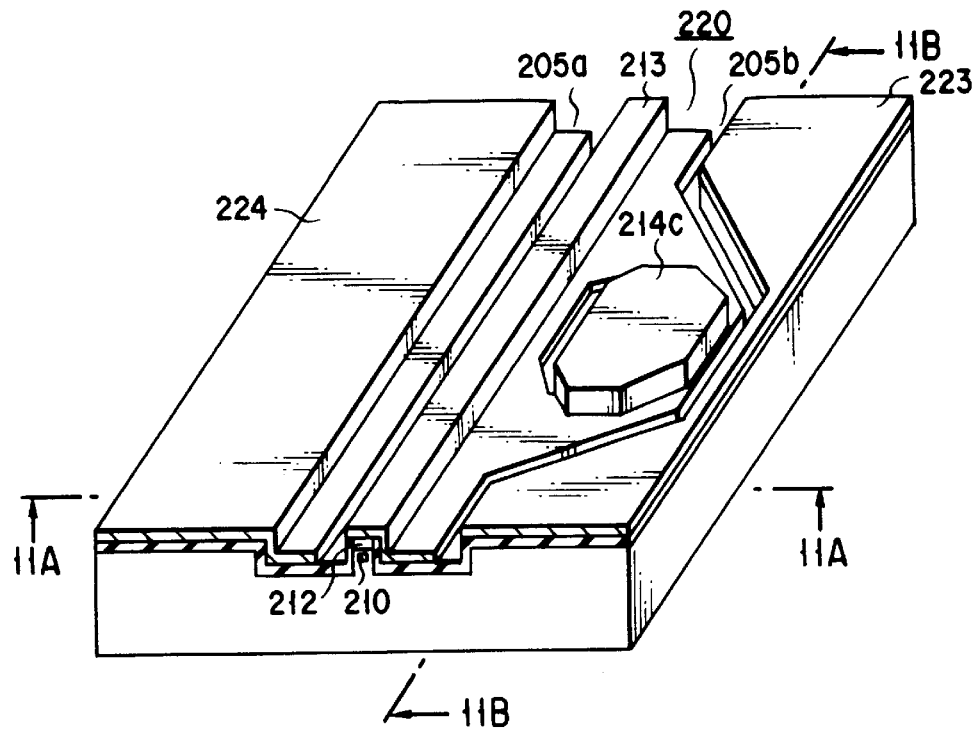
FIG. 12 is a schematic perspective view of a semiconductor laser element according to a modification of the second embodiment of this invention.
Figure 13:
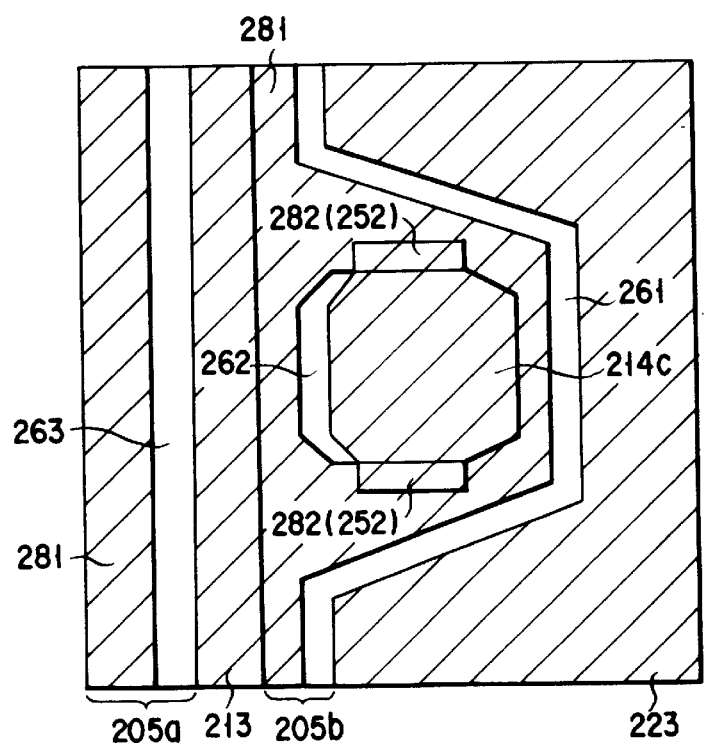
FIG. 13 is a plan view showing an enlarged portion of the peripheral portion of a bonding pad 214, for illustrating the electrode isolating state in FIG. 12.

In the embodiment shown in FIG. 10, the bonding pad has six sides. However, the shape of the bonding pad is not limited to the above shape and the bonding pad may be formed to have eight sides as shown in FIG. 12. FIG. 13 is a plan view showing an enlarged portion of the peripheral portion of the bonding pad 214c. Inclined surfaces 252 are formed on the sides of the bonding pad 214c perpendicular to the stripe 213 and wirings 282 are formed on the inclined surfaces. Since metal particles are applied in an oblique direction from the upper right, an isolating region 261 (an area in which no metal particles are deposited) is formed on the left side surface of the dummy electrode 223. An isolating region 262 is formed on the left side surface of the bonding pad 214c. The bonding pad 214c is connected to the surface electrode 213 via the wirings 282, 281. Further, an isolating region 263 is formed on the left side of the stripe-form surface electrode 213.

If the wet etching process is effected to form a convex portion for bonding pad, the etching of the clad layer (InP) proceeds from four surfaces making 45 degrees with the stripe direction. Therefore, even if the etching mask for the bonding pad is square, the clad layer is etched into an octagonal shape. Therefore, it is preferable to previously make the contact layer (InGaAs) formed on the upper surface of the clad layer, that is, the etching mask in an octagonal shape since formation of an eave of the contact layer can be prevented.

As described above, in this embodiment, since the inclined surface is formed on the side surface of the bonding pad, the electrical connection can be attained with higher reliability.

Embodiment 3

Next, the third embodiment is explained with reference to FIGS. 14, 15. This embodiment relates to another example of the shape of the bonding pad.

FIG. 14 is a schematic perspective view of the semiconductor substrate of an InGaAsP/InP-series semiconductor laser for optical communication, and FIG. 15 is a perspective view of the above semiconductor substrate on which electrodes are formed.

Stripe-form active layers 210 which are formed of, for example, undoped InGaAsP-series compound semiconductor are formed on an n-InP semiconductor substrate 201. On each side of the active layer 210, an n-type InP layer acting as a current block layer and upper and lower p-type InP clad layers disposed on the upper and lower surfaces of the current block layer are formed. Part of the stacked body containing the current block layer is separated from the active layer 210 by means of stripe-form groove portion 205a, 205b.

Like the case of FIG. 7 of the embodiment 1, the groove portions 205a and 205b are formed such that parts of the stacked body will be left behind on both sides of the active layer 210. A p-type InGaAs contact layer is formed on the p-type clad layer. The grooves 205a, 205b are formed on both sides of the active layer 210 to construct a mesa structure. Since the groove portions 205a, 205b are formed such that parts of the stacked body will be left behind on both sides of the active layer 210, the mesa structure is formed with both side surfaces of the active layer surrounded by parts of the stacked body.

A wide hollow space is formed in the groove portion 205b which is one of the groove portions formed on both sides of the active layer 210 and a projecting portion 251d for bonding pad is formed in the hollow space. The surface of the semiconductor substrate 201 except the surface of the electrode portion is covered with an SiO₂ insulative film 207. Further, an ohmic contact electrode (AuZn) 212 for current injection is formed in a stripe form to cover the upper surface of the active layer 210.

In order to form the groove portions 205a, 205b, the same method used in the first embodiment is used. First, a photoresist of preset pattern is formed on the main surface of the semiconductor substrate 201. The photoresist is formed by transferring a design pattern which is designed such that a portion in which the electrode is desired to be isolated will be optically masked and a portion in which a continuous electrode wiring is desired to be formed will not be optically masked.

Next, the main surface of the semiconductor substrate is subjected to the wet etching with the photoresist used as a mask. Like the case of the first embodiment, the p-type contact layer is etched out by use of an etchant for selectively removing the contact layer, and the current block layer and clad layer are etched by HCl which is an etchant with the contact layer used as a mask to form the groove portions 205a, 205b on both sides of the stripe-form active layer 210, and the surface portion of the semiconductor substrate 201 is separated into three island regions 271, 272, 273.

A wide hollow space is formed in the groove portion 205b and the projecting portion 251d is formed in the hollow space (FIG. 14). None of the sides of the projecting portion 251d in the hollow space of the groove portion 205b are set in a direction perpendicular to the stripe direction of the active layer 210. Likewise, none of the sides of the dummy electrode forming portion are set in a direction perpendicular to the stripe direction of the active layer 210 so as to prevent inclined surfaces from being formed on the side surface of the forming portion of the dummy electrode 223.

In the above wet etching process, since the InP semiconductor substrate in which the main surface having the groove portions formed therein has a (100) plane is used as the semiconductor substrate 201 and none of the sides of the projecting portion 251d are set in a direction perpendicular to the stripe direction ((011) direction) of the active layer 210, no inclined surface is formed on any side surface of the projecting portion 251d. Therefore, in this embodiment, the bonding pad will not be connected to the electrode portion via the inclined surface.

In order to vapor-deposit electrode metal on the semiconductor substrate, an electron beam heating vapor-depositing system of high directivity is used to deposit metal particles on the main surface of the semiconductor substrate 201 so as to form electrodes (FIG. 15). The direction of application of the metal particles is set to a direction from the upper right to the lower left in FIG. 15. Since the directivity of the metal particles emitted from the electron beam heating vapor-depositing system is high, separation and connection of the electrode wiring can be easily attained in a self-alignment manner by utilizing the directivity and the irregularity of the main surface of the semiconductor substrate on which metal particles are deposited.

For example, when metal particles are applied to the semiconductor substrate in a direction from the upper right in the drawing, the convex portion on which the right side dummy electrode 223 is formed acts as a barrier to prevent the metal particles from being deposited on a portion near the side surface of the groove portion 205b adjacent thereto. Therefore, part of the element electrode 220 formed on the bottom portion of the groove portion 205b is isolated from the dummy electrode 223. On the other hand, the side surface of the groove portion 205b which lies on the active layer 210 side is exposed to the metal particles and the metal particles are deposited to form a wiring and the like. Therefore, the bonding pad 214d is electrically connected to the surface electrode 213 via a wiring formed on the vertical side surface which is exposed to the metal particles. Likewise, the element electrode 220 and the dummy electrode 224 are isolated on the boundary between the groove portion 205a and the stripe-form convex portion on which the surface electrode 213 is formed. The purpose of the dummy electrode is the same as that of the embodiment 1 and it does not contribute to connection to the circuit or connection between the elements. The electrodes 220, 223, 224 are formed of a Ti/Pt/Au film.

In this embodiment, connection between the bonding pad and the wiring portion can be made without forming inclined surfaces on the bonding pad and the structure is preferable when it is required to reduce the size of the elements.

Embodiment 4

Next, the fourth embodiment is explained with reference to FIGS. 16, 17A, 17B. This embodiment is an example in which a branch (projecting) portion is formed on the stripe-form side surface containing the active layer, inclined surfaces are formed on sides perpendicular to the stripe of the branch, and inverted mesa structures are formed on those of the side surfaces of the groove portion and convex portion on which the inclined surface are not formed.

Figure 16:
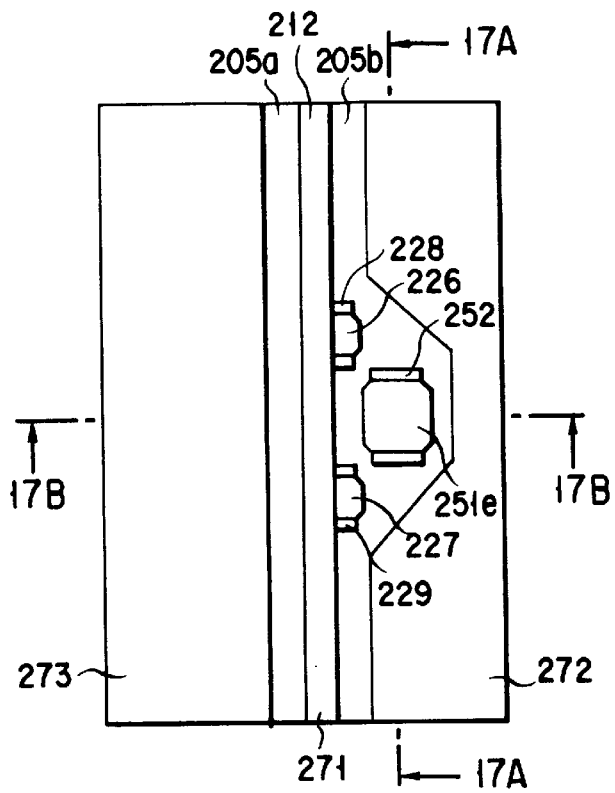
FIG. 16 is a plan view of a semiconductor laser substrate according to a fourth embodiment of this invention.
Figure 17A:
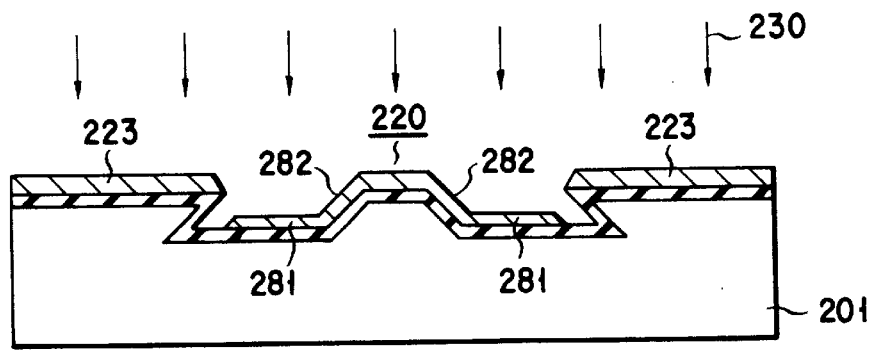
FIGS. 17A and 17B are cross sectional views taken along the lines 17A—17A and 17B—17B of FIG. 16, for illustrating the electrode forming method in the fourth embodiment.
Figure 17B:
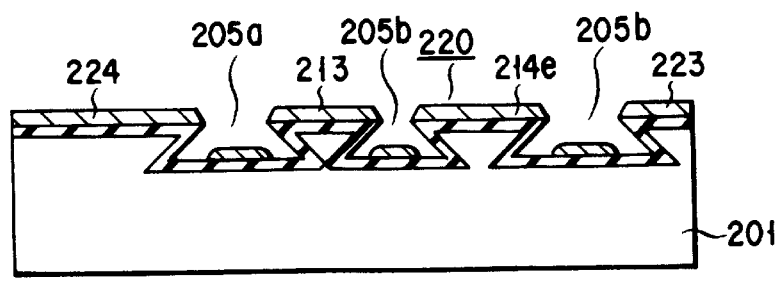

FIG. 16 is a plan view of the semiconductor substrate of an InGaAsP/InP-series semiconductor laser for optical communication, FIGS. 17A and 17B are cross sectional views taken along the lines 17A—17A and 17B—17B of FIG. 16.

Stripe-form active layers 210 which are formed of, for example, undoped InGaAsP-series compound semiconductor are formed on an n-InP semiconductor substrate 201. On each side of the active layer 210, an n-type InP layer acting as a current block layer and upper and lower p-type InP clad layers disposed on the upper and lower surfaces of the current block layer are formed. Part of the stacked body containing the current block layer is separated from the active layer 210 by means of stripe-form groove portions 205a and 205b.

Like the case of FIG. 7 of the embodiment 1, the groove portions 205a and 205b are formed such that parts of the stacked body will be left behind on both sides of the active layer 210. A p-type InGaAs contact layer is formed on the p-type clad layer. The grooves 205a, 205b are formed on both sides of the active layer 210 to construct an (inverted) mesa structure. Since the groove portions 205a, 205b are formed such that parts of the stacked body will be left behind on both sides of the active layer 210, the mesa structure is formed with both side surfaces of the active layer 210 surrounded by parts of the stacked body.

A wide hollow space is formed in the groove portion 205b which is one of the groove portions formed on both sides of the active layer 210 and a projecting portion 251c for bonding pad is formed in the hollow space. The surface of the semiconductor substrate 201 except the surface of the electrode portion is covered with an $SiO_2$ insulative film 207. Further, an ohmic contact electrode (AuZn) 212 for current injection is formed in a stripe form to cover the upper surface of the active layer 210.

In order to form the groove portions 205a, 205b, the same method used in the first embodiment is used. First, a photoresist of preset pattern is formed on the main surface of the semiconductor substrate 201. The photoresist is formed by transferring a design pattern which is designed such that a portion in which the electrode is desired to be isolated will be optically masked and a portion in which a continuous electrode wiring is desired to be formed will not be optically masked.

Next, the main surface of the semiconductor substrate is subjected to the wet etching with the photoresist used as a mask. Like the case of the first embodiment, the p-type contact layer is etched out by use of an etchant for selectively removing the contact layer, and the current block layer and clad layer are subjected to the isotropic etching with the contact layer used as a mask to form the groove portions 205a, 205b on both sides of the stripe-form active layer 210, and the surface portion of the semiconductor substrate 201 is separated into three island regions 271, 272, 273. A wide hollow space is formed in the groove portion 205b and a projecting portion 251e is formed in the hollow space.

Branch portions 226, 227 are formed in the stripe portion in which the active layer 210 is formed and inclined surfaces 228, 229 of (1/1/1) plane and (111) plane are formed on a side extending in a direction perpendicular to the stripe direction ((011) direction) (FIG. 16). Inclined surfaces of (1/1/1) plane and (111) plane are formed on a side of the projecting portion 251e in the wide portion of the groove potion 205b which is perpendicular to the stripe direction of the active layer 210. However, the side surfaces of the wide portion of the groove portion 205b are set in a direction different from that perpendicular to the stripe direction of the active layer 210 so that inclined surfaces will not be formed thereon. Those of the side surfaces of the groove portion 205b and the side surfaces of the projecting portion 251e on which the inclined surfaces are formed in an inverted mesa shape (FIGS. 17A, 17B). The inverted mesa structure can be formed by adequately selecting the type and application condition of the isotropic etchant.

In the above wet etching process, since the InP semiconductor substrate 201 in which the main surface having the groove portions 205a, 205b formed therein has a (100) plane is used as the semiconductor substrate 201 and the branch portions 226, 227 on the stripe portion in which the active layer is formed and the projecting portion 251e are formed to have sides perpendicular to the stripe direction of the active layer 210, inclined surfaces are formed on the sides 228, 229, 252 thereof. In this embodiment, connection to the wiring is made mainly via the inclined surfaces. Therefore, connection to the bonding pad and connection to the wiring portion of the surface electrode 213 can be stably made.

The bonding pad and the branch portion in this embodiment are formed in a rectangular shape, but they are formed in a rectangular shape having rounded corners because of the lattice dependency of the etching as explained in the embodiment 2.

In order to vapor-deposit electrode metal on the semiconductor substrate, an electron beam heating vapor-depositing system of high directivity is used to deposit metal particles on the main surface of the semiconductor substrate 201 so as to form electrodes (FIGS. 17A, 17B). The direction of application of the metal particles is set to a direction from the upper right to the lower left as indicated by an arrow 230 in the drawing. Since the directivity of the metal particles emitted from the electron beam heating vapor-depositing system is high, separation of the electrode wiring can be easily attained in a self-alignment manner by utilizing the directivity and the inverted mesa structure constructed by the side surfaces of the convex portion and the groove portion of the main surface of the semiconductor substrate.

For example, when metal particles are applied to the semiconductor substrate 201 in a direction from above the semiconductor substrate in the drawing, the metal particles on the bottom portion of the groove portions 205a, 205b and the metal particles on the convex portions on both sides of the groove portions are separated and the electrodes are divided into the element electrode 220, dummy electrodes 223 and 224. In the electrode 220, the bonding pad 214e is electrically connected to the wiring via the inclined surface of the projecting portion 251. The dummy electrode does not contribute to connection to the circuit or connection between the elements. The electrodes 220, 223, 224 are formed of a Ti/Pt/Au film.

Figure 18A:
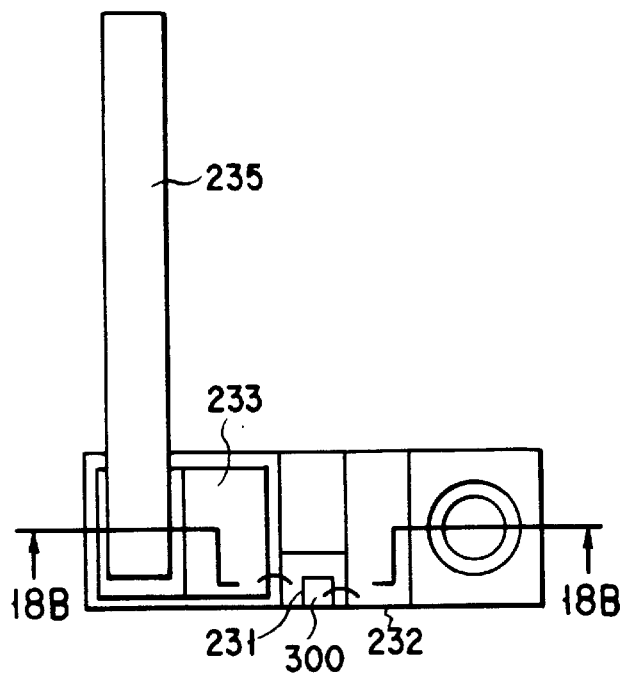
FIGS. 18A and 18B are plan and cross sectional views of the semiconductor laser device showing the state in which the semiconductor laser element of this invention is incorporated into a package.
Figure 18B:
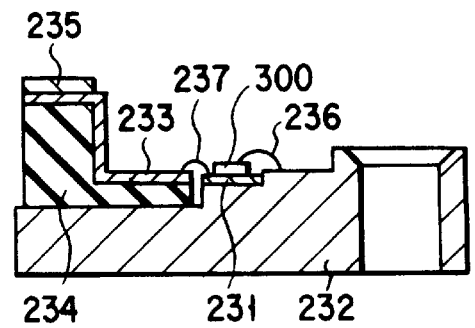

Next, an example of the semiconductor laser device formed by mounting electrodes and leads on the semiconductor laser element formed in the above embodiment is explained with reference to FIGS. 18A, 18B. FIGS. 18A and 18B are plan and cross sectional views of the semiconductor laser device, respectively. The anode electrode of the semiconductor laser device is formed of a copper base 232 metallized with gold. A heat sink 231 is mounted on the upper surface of the copper base 232 and a semiconductor laser element 300 is bonded on the heat sink. A ceramic base 234 having a metallic cathode 233 on the surface thereof is bonded on the copper base 232. A cathode lead 235 is attached to the cathode electrode 233. The electrode of the laser element explained in the above embodiment is an anode electrode and is electrically connected to the anode electrode 232 of the laser device via a bonding wire 236 of Au or the like. The bonding wire 236 is connected to the bonding pad 214 of the element electrode 220 of the laser element 300. Although not shown in the drawing, a cathode electrode is formed on the rear surface of the semiconductor laser element 300 and the cathode electrode is electrically connected to the cathode electrode 233 of the laser device via the heat sink 231. The heat sink 231 and the cathode electrode 233 are electrically connected to each other via a wire bonding 237 of Au or the like.

As described above, in this embodiment, the compound semiconductor laser for optical communication is explained, but this invention can be applied to another semiconductor device. Further, dry etching such as RIE (Reactive Ion Etching) can be used instead of the wet etching using the etching solution in the embodiment.

Embodiment 5

Next, the fifth embodiment is explained with reference to FIGS. 19, 20.

In the former embodiment, the bonding pad portion is formed on the projecting portion of the main surface of the semiconductor substrate, but this invention can also be applied to a case wherein the bonding pad portion is formed on the concave portion. In this case, the bonding pad portion is surrounded by the convex portion of the main surface of the semiconductor substrate.

Figure 19:
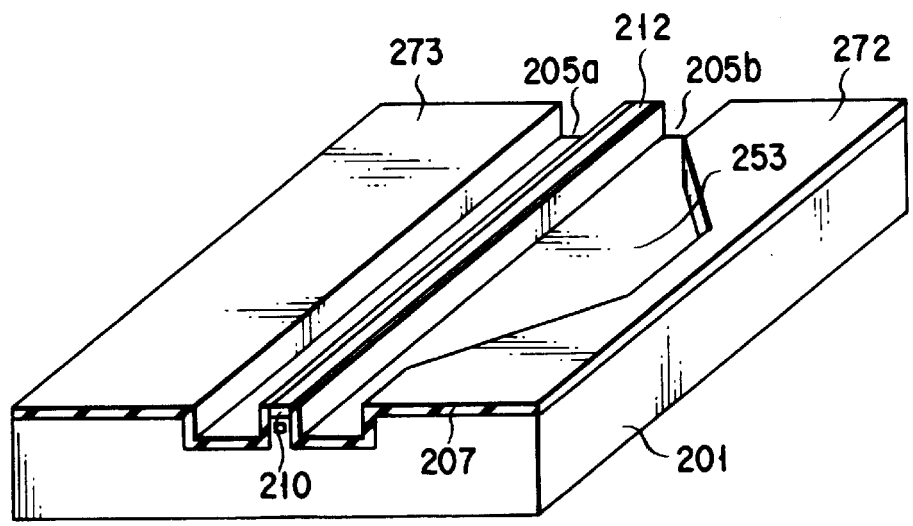
FIG. 19 is a schematic perspective view of a semiconductor laser substrate according to a fifth embodiment of this invention.

FIG. 19 is a schematic perspective view of the semiconductor substrate of an InGaAsP/InP-series semiconductor laser for optical communication, and FIG. 20 is a schematic perspective view of the semiconductor structure obtained by forming electrodes on the semiconductor substrate. The composition and internal structure of the semiconductor substrate 201 are the same as those of the third embodiment shown in FIG. 14. Groove portions 205a, 205b are formed on both sides of the active layer 210 to construct a mesa structure. A wide hollow space 253 is formed in the groove portion 205b which is one of the groove portions formed on both sides of the active layer 210. The surface of the semiconductor substrate 201 except the surface of the electrode portion is covered with an $SiO_2$ insulative film 207. Further, an ohmic contact electrode (AuZn) 212 for current injection is formed in a stripe form to cover the upper surface of the active layer 210. In order to form the groove portions 205a, 205b in the main surface of the semiconductor substrate, the same wet etching process as that used in the first embodiment is used.

The wide hollow space 253 is formed in the groove portion 205b by the above method and a bonding pad portion is formed in this portion. Therefore, a convex portion 272 on which a dummy electrode is formed surrounds the bonding pad portion. The convex portion 272 surrounding the wide portion is formed so as not to have any side perpendicular to the stripe direction of the active layer 210 so as to prevent inclined surfaces from being formed on the side surface thereof.

In the wet etching process, since the InP semiconductor substrate 201 in which the main surface having the groove portions formed therein has a (100) plane is used as the semiconductor substrate 201 and none of the sides of the convex portion 272 are set in a direction perpendicular to the stripe direction ((011) direction) of the active layer 210, no inclined surface is formed on any side surface of the convex portion 272. Therefore, in this embodiment, the bonding pad will not be connected to the electrode portion via the inclined surface (FIG. 19).

In order to vapor-deposit electrode metal on the semiconductor substrate, an electron beam heating vapor-depositing system of high directivity is used to deposit metal particles on the main surface of the semiconductor substrate 201 so as to form electrodes (FIG. 20). The direction of application of the metal particles is set to a direction from the upper right to the lower left in FIG. 20. Since the directivity of the metal particles emitted from the electron beam heating vapor-depositing system is high, separation and connection of the electrode wiring can be easily attained in a self-alignment manner by utilizing the directivity and the irregularity of the main surface of the semiconductor substrate on which metal particles are deposited.

For example, when metal particles are applied to the semiconductor substrate in a direction from the upper right in the drawing, the convex portion 272 on which the right side dummy electrode 223 is formed acts as a barrier to prevent the metal particles from being deposited on a portion near the side surface of the groove portion 205b adjacent thereto. Therefore, the element electrode 220 formed on the bottom portion of the groove portion 205b is isolated from the dummy electrode 223. On the other hand, the side surface of the groove portion 205b opposite to the above side surface is exposed to the metal particles and the metal particles are deposited to form a wiring and the like. Therefore, in the element electrode 220, the bonding pad 214f is electrically connected to the surface electrode 213 of the element electrode 220 via the vertical side surface. Further, since there is an area in which the metal particles are not deposited on the boundary portion between the groove portion 205a having no wide portion and the stripe-form convex portion on which the electrode portion 213 is formed, the surface electrode portion 213 and the dummy electrode 224 are isolated from each other. The dummy electrode does not contribute to connection to the circuit or connection between the elements. The electrodes 220, 223, 224 are formed of a Ti/Pt/Au film.

FIGS. 21 and 22 are a perspective view and plan view indicating the crystal orientations of the compound semiconductor substrates used in the semiconductor devices of this invention explained in the above embodiments. The crystal plane of the main surface of the semiconductor substrate 201 on which the active layer 210 is formed is a (100) plane. The stripe-direction of the stripe-form active layer 210 is a (011) direction, and therefore, the resonant surface A at which the active layer 210 is exposed has a (011) plane. The inclined surface 252 of the convex portion 251 has a (111) plane and (1/1/1) plane.

The above embodiments relate to the BH structure (Buried Hetero structure). However, this invention can be applied to the RWG structure (Ridge-Waveguide structure) and one example is explained below.

Embodiment 6

FIG. 23 is a schematic perspective view of an InGaAsP/InP-series compound semiconductor laser for optical communication according to a sixth embodiment. This embodiment is different from the above embodiments only in the structure of the semiconductor substrate and the electrode structure on the surface is exactly the same, and therefore, the method of this invention can be applied to effect the electrode forming process.

A light emitting layer of DH structure (Double Hetero structure) having an InGaAsP-series active layer 302 and p-InP clad layer 303 and n-InP clad layer 304 which are disposed on the upper and lower surfaces of the active layer is formed in a plane form on an n-InP semiconductor substrate 301. A p-InGaAs contact layer 306 is formed on the entire surface of the p-InP clad layer.

A mask of a shape corresponding to the electrode shape is formed on the contact layer 306 and the same etching process as in the embodiment 1 is effected to remove an unnecessary portion of the contact layer 306. Next, the p-InP clad layer 303 is selectively etched out with the patterned contact layer 306 used as a mask by HCl. At this stage, convex portions such as bonding pads and inclined surfaces thereof are formed.

An insulative film 307 is formed on the entire surface portion of the substrate obtained when the active layer 302 is exposed by etching and in a preset area. After this, an insulative film 307 on the upper portion of a ridge portion on which the surface electrode 213 is formed in the later step is removed in a stripe form. Then, an ohmic contact electrode (AuZn) 212 is formed on the p-type contact layer 306 on the ridge portion.

After this, like the former embodiments, an electrode material is vapor-deposited in an oblique direction from above the bonding pad side to form an element electrode 220 constructed by the surface electrode 213 and bonding pad 214g which are electrically connected to each other and dummy electrodes 223, 224 which are electrically isolated from each other.

Thus, this invention can simplify the electrode forming process even in the semiconductor device of RWG structure.

As described above, in this invention, the wiring can be easily performed on the semiconductor substrate having an irregular surface. Further, the wiring can be performed in a self-alignment manner by. arranging the grooves and mesa structure such that a portion in which electrode metal is desired to be disconnected will be optically masked and a portion in which electrode metal is desired to be made continuous will not be optically masked, and as a result, the manufacturing process can be simplified. Further, in a case where the dummy electrode is formed flush with the bonding pad, the adhesion between the mask and the substrate at the time of masking is enhanced to prevent the processing step from giving a bad influence to the bonding pad.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
    a rectangular semiconductor chip having a main surface;
    a stripe-form semiconductor element forming portion formed in parallel to one of the sides of said semiconductor chip to cross the main surface;
    a first island portion formed on the main surface of said semiconductor chip and separated from said stripe-form element forming portion by a first groove portion formed along one of the sides of said semiconductor element forming portion in a longitudinal direction;

a second island portion formed on the main surface of said semiconductor chip and separated from said stripe-form element forming portion by a second groove portion formed along the other of the sides of said semiconductor element forming portion in the longitudinal direction, said second groove portion including a hollow space which enlarges a width of said second groove portion in a direction away from said semiconductor element in substantially a central portion of a longitudinal length of said second groove portion;

a surface electrode formed on at least part of an upper portion of said semiconductor elements forming portion;

an external lead connecting terminal electrode formed in said hollow space;

a wiring including at least a portion formed on part of a bottom surface of said second groove portion and that one of side surfaces of said second groove portion which is adjacent to said semiconductor element forming portion, for electrically connecting said surface electrode to said terminal electrode;

a first dummy electrode formed on said first island portion; and a second dummy electrode formed on said second island portion.

2. A semiconductor device according to claim 1, wherein said surface electrode is disconnected from said first dummy electrode at least at that one of side surfaces of said first groove portion which is adjacent to said stripe-form semiconductor element forming portion, and said second dummy electrode is disconnected from said wiring at least at that one of the side surfaces of said second groove portion which is adjacent to said second dummy electrode.

3. A semiconductor device according to claim 1, further comprising a mesa projecting portion formed in the hollow space and having a side surface on which said wiring is formed to extend, wherein said terminal electrode is formed on an upper surface of said projecting portion and connected to said surface electrode via said wiring which is formed to extend on the side surface of said projecting portion.

4. A semiconductor device according to claim 3, wherein the upper surface of said projecting portion is made flush with the main surface of said chip.

5. A semiconductor device according to claim 3, wherein said projecting portion is formed to have a side which is perpendicular to the other of the sides of said semiconductor element forming portion and an inclined surface extending to an exterior of said projecting portion towards the bottom surface of said second groove portion from an above side, and said wiring is formed on the inclined surface.

6. A semiconductor device according to claim 3, wherein the side surface of said projecting portion except a portion in which the inclined surface is formed has a side surface which is formed to vertically or inwardly extend from an edge portion of the upper surface of said projecting portion.

7. A semiconductor device according to claim 1, wherein said semiconductor element forming portion is formed to include a branch portion extending in a direction towards the hollow space included in said second groove portion, said branch portion is formed to have a side which is perpendicular to the other of the sides of said semiconductor element forming portion and an inclined surface extending to an exterior of said branch portion towards the bottom surface of said second groove portion from an above side, and said wiring is formed on the inclined surface.

8. A semiconductor device according to claim 7, wherein the side surfaces of said semiconductor element forming portion except a portion in which said branch portion is formed have side surfaces which are formed to vertically or inwardly extend from edge portions of the upper surface of said semiconductor element forming portion.

9. A semiconductor device according to claim 1, wherein side surfaces of areas in which said first dummy electrode and said second dummy electrode are formed adjacent to said first groove portion and said second groove portion, respectively, have side surfaces vertically or inwardly extending from edge portions of upper surfaces of the areas.

10. A semiconductor device according to claim 1, wherein said second island portion faces said semiconductor element forming portion only with side surfaces of said second island portion formed in parallel and obliquely to the longitudinal direction of said semiconductor element forming portion.

11. A semiconductor device according to claim 1, wherein a plane shape of said hollow space is a trapezoid having a side formed in connection with a longitudinal part of said second groove portion along said stripe-form semiconductor element forming portion as a bottom side and an upper side shorter than the bottom side which is positioned on a side of said second dummy electrode.

12. A semiconductor device according to claim 1, wherein the longitudinal direction of said semiconductor element forming portion is a (011) direction.

13. A semiconductor device comprising:

a rectangular semiconductor chip having a main surface;

a stripe-form semiconductor element forming portion formed in parallel to one of the sides of said semiconductor chip to cross the main surface;

a first island portion formed on the main surface of said semiconductor chip and separated from said stripe-form element forming portion by a first groove portion formed along one of the sides of said semiconductor element forming portion in a longitudinal direction;

a second island portion formed on the main surface of said semiconductor chip and separated from said stripe-form element forming portion by a second groove portion formed along the other of the sides of said semiconductor element forming portion in the longitudinal direction, said second groove portion including a hollow space which enlarges a width of said second groove portion in a direction away from said semiconductor element in substantially a central portion of a longitudinal length of said second groove portion, and having a side surface facing said stripe-form semiconductor element formation portion only with a side surface formed in parallel and obliquely to the longitudinal direction of said semiconductor element forming portion;

a surface electrode formed on at least part of an upper portion of said semiconductor element forming portion;

an external lead connecting terminal electrode formed in said hollow space;

a wiring including at least a portion formed on part of a bottom surface of said second groove portion and that one of side surfaces of said second groove portion which is adjacent to said semiconductor element forming portion, for electrically connecting said surface electrode to said terminal electrode;

a first dummy electrode formed on said first island portion said first dummy electrode being disconnected from said surface electrode at least at that one of the side surfaces of said first groove portion which is adjacent to said stripe-form semiconductor element forming portion; and a second dummy electrode formed on said second island portion, said second dummy electrode being disconnected from said wiring at least at that one of the side surfaces of said second groove portion which is adjacent to said second dummy electrode, wherein said surface electrode, said external lead connecting terminal electrode, said wiring, said first dummy electrode and said second dummy electrode are simultaneously formed by applying a conductive material in an oblique direction from an upper side of an outer edge of said second dummy electrode, perpendicular to the longitudinal direction of said stripe-form semiconductor element forming portion, by a vacuum deposition method of high directivity.

14. A semiconductor device according to claim 13, further comprising a mesa projecting portion formed in the hollow space and having a side surface on which said wiring is formed to extend, wherein said terminal electrode is formed on an upper surface of said projecting portion and connected to said surface electrode via said wiring which is formed to extend on the side surface of said projection portion.

15. A semiconductor device according to claim 14, wherein the upper surface of said projecting portion is made flush with the main surface of said chip.

16. A semiconductor device according to claim 14, wherein said projection portion is formed to have a side which is perpendicular to the longitudinal side of said semiconductor element forming portion and an inclined surface extending to an exterior of said projecting portion towards the bottom surface of said second groove portion from an edge portion of the side, and said wiring is formed on the inclined surface.

17. A semiconductor device according to claim 14, wherein the side surface of said projecting portion except a portion in which the inclined surface is formed has a side surface which is formed to vertically extend from an edge portion of the upper surface of said projecting portion.

18. A semiconductor device according to claim 13, wherein said semiconductor element forming portion is formed to include a branch portion extending in a direction towards the hollow space included in said second groove portion, said branch portion is formed to have a side which is perpendicular to the longitudinal side of said semiconductor element forming portion and an inclined surface extending to an exterior of said branch portion towards the bottom surface of said second groove portion from an edge portion of the side, and said wiring is formed on the inclined surface.

19. A semiconductor device according to claim 18, wherein the side surfaces of said semiconductor element forming portion except a portion in which said branch portion is formed have side surfaces which are formed to vertically extend from edge portions of the upper surface of said semiconductor element forming portion.

20. A semiconductor device according to claim 13, wherein side surfaces of said first and second island portions have side surfaces vertically extending from respective edge portions of upper surfaces of said first and said second island portions.

21. A semiconductor device according to claim 13, wherein a plane shape of said hollow space is a trapezoid having a side formed in connection with a longitudinal part of said second groove portion along said stripe-form semiconductor element forming portion as a bottom side and an upper side shorter than the bottom side which is positioned on a side of said second dummy electrode.

* * * * *

UNITED STATES PATENT AND TRADEMARK OFFICE
CERTIFICATE OF CORRECTION

PATENT NO. : 5,880,487
DATED : March 09, 1999
INVENTOR(S) : Chisato FURUKAWA et al.

It is certified that error appears in the above-identified patent and that said Letters Patent is hereby corrected as shown below:

Claim 1, Column 21, line 15, "elements" should read --element--.

Claim 13, Column 22, line 66, after "portion", insert --,--.

Signed and Sealed this

Eighteenth Day of January, 2000

Attest:

Q. TODD DICKINSON

*Attesting Officer*  *Commissioner of Patents and Trademarks*